United States Patent
Kitano et al.

(10) Patent No.: US 6,824,616 B2
(45) Date of Patent: Nov. 30, 2004

(54) SUBSTRATE PROCESSING METHOD AND SUBSTRATE PROCESSING SYSTEM

(75) Inventors: Takahiro Kitano, Kumamoto (JP); Shinichi Sugimoto, Kumamoto (JP); Shinji Kobayashi, Kumamoto (JP); Naoya Hirakawa, Kumamoto (JP); Akira Fukutomi, Kumamoto (JP); Nobukazu Ishizaka, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/121,612

(22) Filed: Apr. 15, 2002

(65) Prior Publication Data
US 2002/0150691 A1 Oct. 17, 2002

(30) Foreign Application Priority Data
Apr. 17, 2001 (JP) ........................................ 2001-118723

(51) Int. Cl.⁷ .................... C23C 14/00; B05C 11/00; B05C 11/06; B05C 5/00
(52) U.S. Cl. ...................... 118/666; 118/58; 118/50; 118/323
(58) Field of Search ................... 118/50, 52, 58, 118/62, 63, 64, 323, 666, 320, 50.1, 66; 427/240, 425, 350, 335, 377, 372.2, 378

(56) References Cited
U.S. PATENT DOCUMENTS 6,413,317 B1 * 7/2002 Miyazaki et al. ........... 118/620
6,447,608 B1 * 9/2002 Sakai et al. .................... 118/52
6,530,340 B2 * 3/2003 You et al. ..................... 118/696
6,599,366 B1 * 7/2003 Kitano et al. ................ 118/666

FOREIGN PATENT DOCUMENTS
JP          200185416    * 3/2001    ........... H01L/21/31

OTHER PUBLICATIONS
English Computer Translation of JP200185416 by Miyazaki et al., Sep. 14, 1999.*

* cited by examiner

Primary Examiner—Christopher A. Fiorilla
Assistant Examiner—Yewebdar Tadesse
(74) Attorney, Agent, or Firm—Oblon, Spivak, McClelland, Maier & Neustadt, P.C.

(57) ABSTRACT

The present invention relates to a processing method for processing a substrate, and comprises a step of coating a coating solution on a surface of the substrate while relatively moving a coating solution discharge nozzle and the substrate and discharging the coating solution from the nozzle onto the substrate. Thereafter, the substrate is exposed to a solvent atmosphere of the coating solution or the pressure is temporarily applied thereto in a container. Thereafter, the pressure inside the container in which the substrate is housed is reduced to dry the coating solution on the substrate. According to the present invention, it is possible to narrow the so-called edge cutting width, which is at a periphery part of the substrate and is not commercialized, and to maintain an in-plane uniformity of the coating film.

12 Claims, 18 Drawing Sheets

SUBSTRATE PROCESSING METHOD AND SUBSTRATE PROCESSING SYSTEM

BACKGROUND OF THE INVENTION

1. Field of the Invention

The present invention relates to a substrate processing method and a substrate processing system.

2. Description of the Related Art

In a photolithography process in a fabrication process of, for example, a semiconductor wafer (hereinafter referred to as a "wafer"), a resist solution is coated onto a surface of the wafer, and the wafer undergoes a resist coating treatment for forming a resist film, an exposure processing for exposing a pattern to the wafer, a developing treatment for developing the wafer after the exposure and the like, so that a predetermined circuit pattern is formed on the wafer.

As the resist coating treatment, a dominant method today is a spin-coating method which discharges the resist solution to the center of the rotated wafer to diffuse the resist solution over the surface of the wafer.

However, since the wafer is rotated a high speed according to the spin-coating method, high volume of the resist solution scatters from the peripheral edge part of the wafer, and therefore a lot of the resist solution is wasted. Additionally, since the unit is contaminated by the scatter of the resist solution, there are disadvantages that the unit needs to be cleaned frequently and so on.

Hence, instead of the spin-coating method which rotates the wafer, a method of discharging the resist solution onto the wafer while relatively moving the wafer and a resist solution discharge nozzle so that a path of a resist solution discharge part becomes a rectangular wave shape with large amplitude, which results in that the wafer is coated evenly with the resist solution in a plurality of parallel lines, that is, a method of coating of the so-called one continuous writing stroke is conceivable. In this coating method of one continuous writing stroke, there is a possibility that the surface of the resist film after the coating swells along the coating path of the resist solution, and hence it is preferable to use the resist solution having low viscosity which spreads easily over the wafer after the coating, and to flatten the coating film after completion of the coating.

By the way, it is recently demanded to further narrow the so-called "edge cutting width", which is at the peripheral edge part of the substrate and is not commercialized, and hence a technology for narrowing the edge cutting width needs to be developed in the above-described coating method of the so-called one continuous writing stroke as well. In order to narrow the edge cutting width, it is necessary to increase the viscosity of the resist solution so that the resist solution in the periphery of the wafer does not swell.

However, when the viscosity of the resist solution is increased in the coating method of one continuous writing stroke, the resist solution discharged onto the wafer becomes hard to be spread and to be smoothed in flattening processing after that, and hence film thickness is thickened along the coating path of the resist solution, and an in-plane uniformity of the resist film is decreased. Namely, in the coating method of the so-called one continuous writing stroke, lowering the viscosity of the resist solution in order to narrow the edge-cutting width and maintaining the in-plane uniformity of the resist solution are inconsistent to each other.

SUMMARY OF THE INVENTION

The present invention is made in view of the above-described points, and it is an object of the present invention to narrow an edge cutting width while using a coating solution having high viscosity and to maintain an in-plane uniformity of a coating film, even when coating processing of a substrate such as a wafer is performed in the manner of the so-called one continuous writing stroke.

In view of the above object, a processing method of the present invention comprises the steps of coating a coating solution on a surface of the substrate while relatively moving a coating solution discharge nozzle and the substrate and discharging the coating solution onto the substrate from the coating solution discharge nozzle, exposing the substrate to a solvent atmosphere of the coating solution after the step of coating, and reducing pressure inside a container in which the substrate is housed after the step of exposing.

According to another aspect of the present invention, a processing method of the present invention, for processing a substrate, comprises the steps of coating a coating solution on a surface of the substrate while relatively moving a coating solution discharge nozzle and the substrate and discharging the coating solution onto the substrate from the coating solution discharge nozzle, applying pressure inside a container in which the substrate is housed after the step of coating, and reducing pressure inside the container in which the substrate is housed after the step of applying pressure.

According to the present invention, for example, after the coating solution is coated in the manner of the so-called one continuous writing stroke, the substrate is exposed to the solvent atmosphere, whereby the solvent adheres to the surface of the coating solution and the viscosity of the surface of the coating solution can be decreased. Thereafter, by reducing the pressure inside the container in which the substrate is housed and forming airflow inside the container, the surface of the substrate whose viscosity is decreased is smoothed and flattened. At the same time, the solvent is evaporated and the substrate is dried by the airflow. Thereby, even when the coating solution having high viscosity is coated, the in-plane uniformity of the film thickness of the coating film can be maintained. Therefore, even when the coating solution is coated in the manner of the so-called one continuous writing stroke, it is possible to use the coating solution having high viscosity, and to narrow the edge cutting width.

When the pressure is applied inside the container in which the substrate is housed, instead of exposing the substrate to the solvent atmosphere, it is possible to prevent volatilization of the coating solution on the surface of the substrate and to allow the substrate and the coating solution to get to know well each other, thereby improving the flattening during reduced-pressure drying after that.

A processing system of the present invention can perform the above-described processing method efficiently.

Namely, a processing system of the present invention comprises a coating unit for coating the substrate with a coating solution, a solvent atmosphere unit for exposing the substrate to a solvent atmosphere of the coating solution, and a reduced-pressure drying unit for subjecting the substrate to reduced-pressure drying, wherein the coating unit comprises a coating solution discharge nozzle for discharging the coating solution onto the substrate, and a moving mechanism for relatively moving the coating solution discharge nozzle and the substrate, wherein the solvent atmosphere unit comprises a chamber for holding the substrate in a prescribed atmosphere, and a solvent vapor supply mechanism for supplying a solvent vapor of the coating solution of a prescribed concentration into the chamber through a supply pipe, and wherein the reduced-pressure drying unit comprises a pressure reducing mechanism for reducing pressure inside a container in which the substrate is housed. Therefore, it is possible to narrow the edge cutting width while using the coating solution having high viscosity and to maintain the in-plane uniformity of the coating film formed on the substrate.

According to another aspect of the present invention, a processing system of the present invention comprises a coating unit for coating the substrate with a coating solution, and a reduced-pressure drying unit for exposing the substrate to a solvent atmosphere of the coating solution and thereafter subjecting the substrate to reduced-pressure drying, wherein the coating unit comprises a coating solution discharge nozzle for discharging the coating solution onto the substrate, and a moving mechanism for relatively moving the coating solution discharge nozzle and the substrate, and wherein the reduced-pressure drying unit comprises a container for housing the substrate and containing the substrate airtightly, a solvent vapor supply mechanism for supplying a solvent vapor of the coating solution of a prescribed concentration into the container through a supply pipe, and a pressure reducing mechanism for reducing pressure inside the container.

As described above, the processing system of the substrate includes either the coating unit which can perform the coating method of the so-called one continuous writing stroke, the solvent atmosphere unit which can expose the substrate to the solvent atmosphere and the reduced-pressure drying unit which can subject the substrate to the reduced-pressure drying, or the aforesaid coating unit and the reduced-pressure drying unit which can expose the substrate to the solvent atmosphere and subject the substrate to the reduced-pressure drying, and therefore, it can perform the above-described processing method of the present invention preferably. Therefore, it is possible to narrow the "edge cutting width" while using the coating solution having high viscosity and to maintain the in-plane uniformity of the coating film formed on the substrate. Moreover, according to the latter processing system, the processing of exposing the substrate to the solvent atmosphere and the processing of subjecting the substrate to the reduced-pressure drying can be preformed in the same reduced-pressure drying unit, and hence it is possible to save time of carrying the substrate. Furthermore, it is possible to mount larger number of processing units in the processing unit, and hence its processing capacity can be improved.

DETAILED DESCRIPTION OF THE PREFERRED EMBODIMENT

Figure 1:
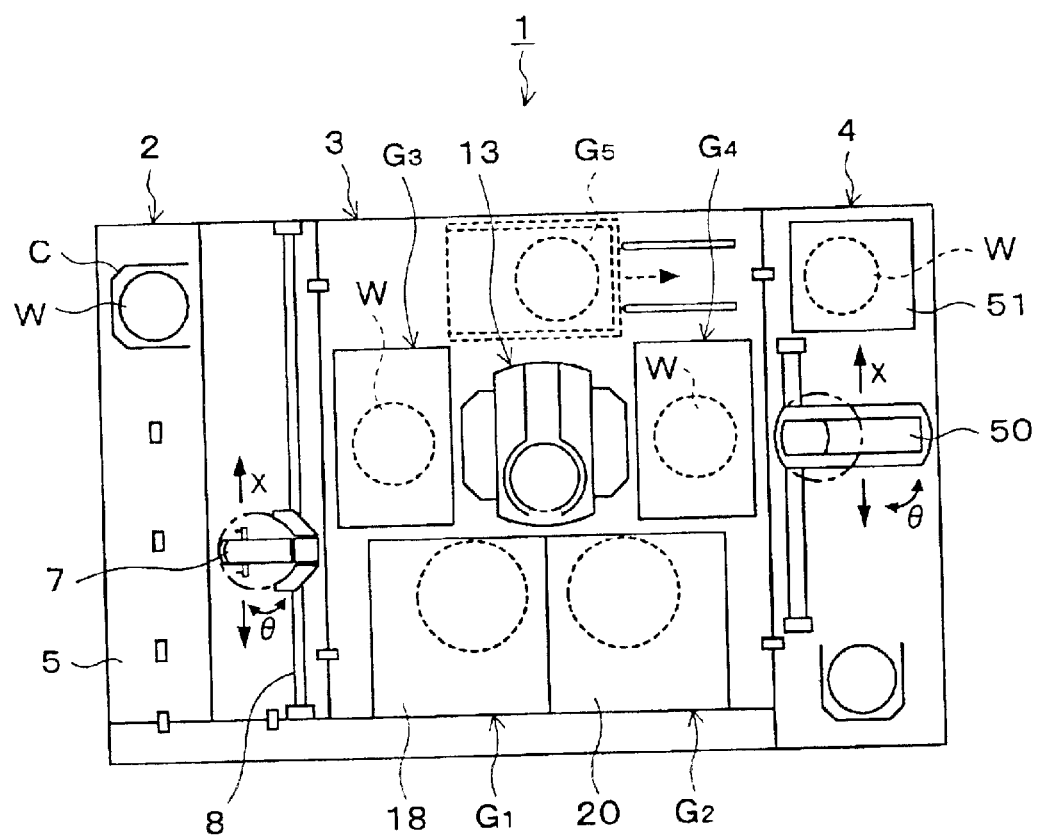
FIG. 1 is a plane view showing an outline of the structure of a coating and developing system according to an embodiment.
Figure 2:
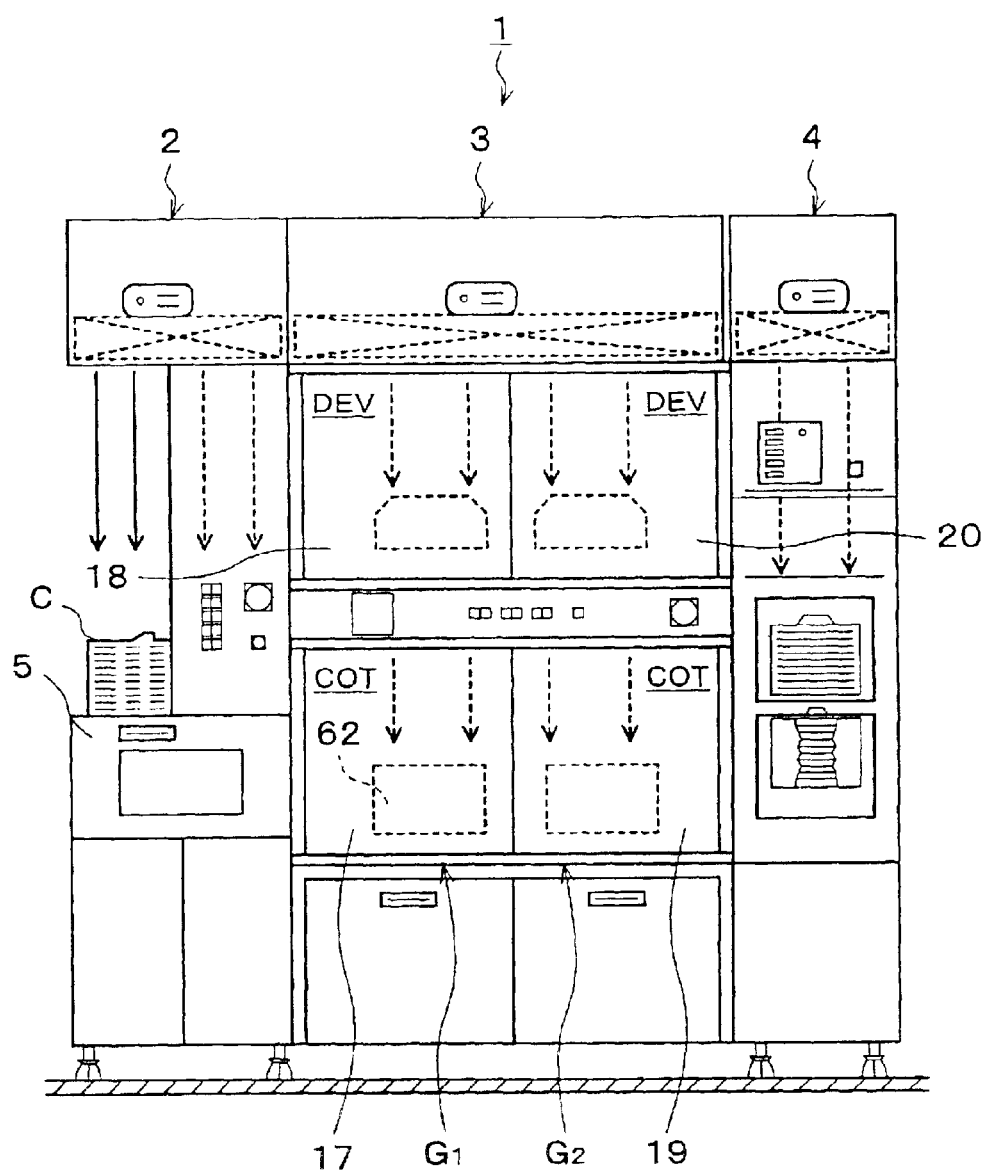
FIG. 2 is a front view of the coating and developing system in FIG. 1.
Figure 3:
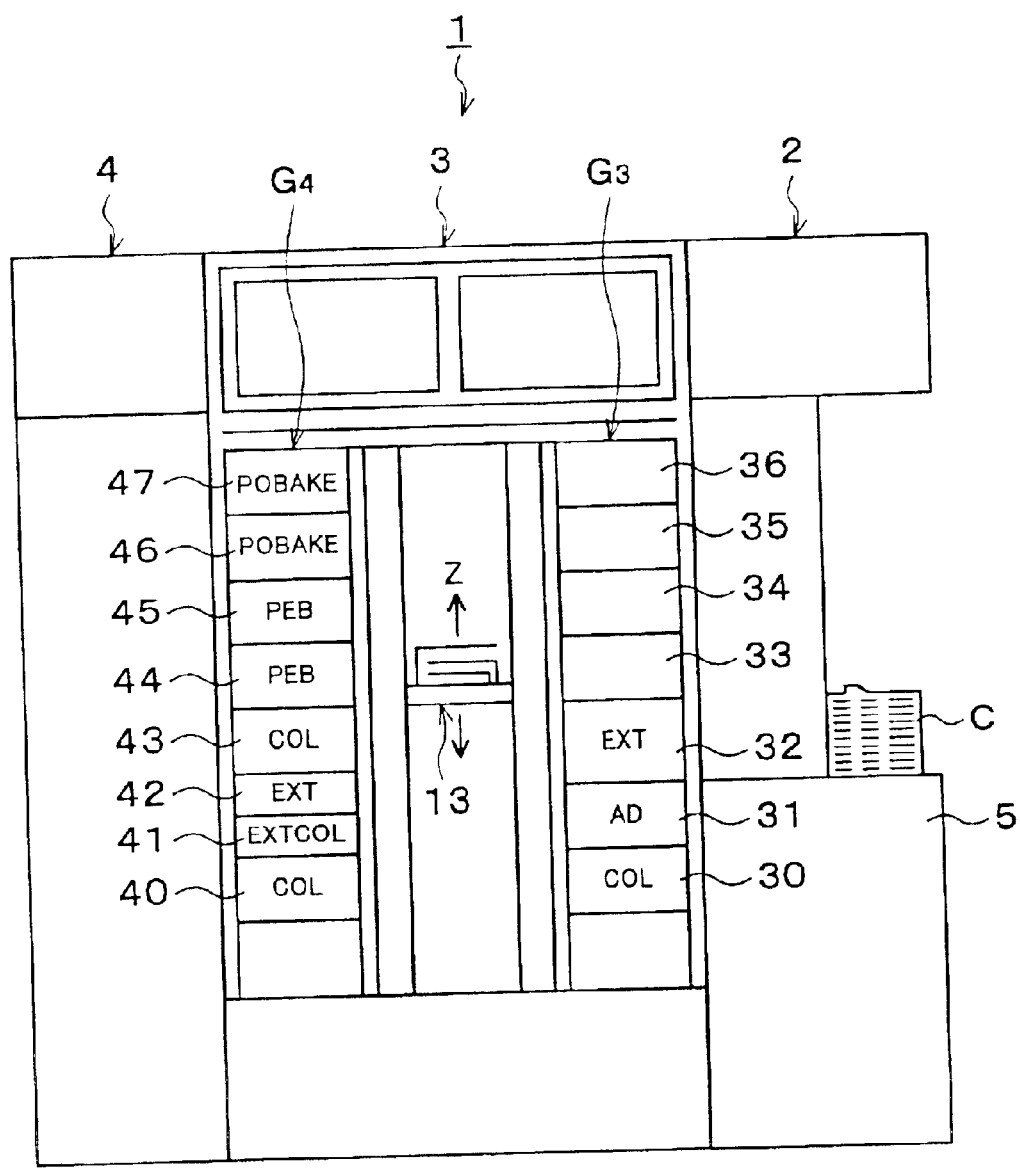
FIG. 3 is a rear view of the coating and developing system in FIG. 1.

Hereinafter, preferred embodiments of the present invention will be explained. FIG. 1 is a plane view showing an outline of the structure of a coating and developing system 1 as a processing system of a substrate according to the present invention, FIG. 2 is a front view of the coating and developing system 1, and FIG. 3 is a rear view of the coating and developing system 1.

The coating and developing system 1, as shown in FIG. 1, has a structure in which a cassette station 2 which carries, for example, 25 wafers W in a cassette into/out of the coating and developing system 1 from/to the outside and carries the wafer W into/out of a cassette C, a processing station 3 in which various processing and treatment units are arranged in multiple layers for operating predetermined processing and treatment in a single wafer type in a process of coating and developing and an interface section 4 which delivers the wafer W from/to a not-shown exposure unit provided next to the processing station 3 are integrally connected.

In the cassette station 2, a plurality of the cassettes C are freely mounted in an X direction (in a top and bottom direction in FIG. 1) in a line at predetermined positions on a cassette mounting table 5 as a mounting section. Further, a wafer carrier 7 which can be transported to the cassette alignment direction (X direction) and a wafer alignment direction (Z direction; a vertical direction) of the wafers W housed in the cassette C is provided to be movable along a carrier path 8, and is accessible selectively to the respective cassettes C.

The wafer carrier 7 has an alignment function for performing alignment of the wafer W. This wafer carrier 7 is also structured to be accessible to an extension unit 32 which belongs to a third processing unit group G3 of the processing station 3 side, as will be described later.

In the processing unit 3, a main carrier unit 13 is provided in its center part, and in the periphery around the main carrier unit 13, various processing units are provided in multiple layers to compose processing unit groups. In this coating and developing system 1, four processing unit groups G1, G2, G3 and G4 are arranged, in which first and second processing unit groups G1 and G2 are arranged on the front side of the coating and developing system 1, the third processing unit group G3 is arranged next to the cassette station 2, and a fourth processing unit group G4 is arranged next to the interface section 4. Further, an extra fifth processing unit group G5 can be optionally arranged on the rear side, as shown in a broken line. The main carrier unit 13 can carry the wafer W into/out of the later-described various processing units which are arranged in the processing unit groups G1, G2, G3, G4 and G5. It should be noted that the number and the arrangement of the processing unit groups vary according to types of processing to be given to the wafer W, and the number of the processing unit groups is not necessarily four, as long as it is equal to or bigger than one.

In the first processing unit group G1, for example as shown in FIG. 2, a resist coating unit 17 for coating the wafer W with a resist solution as a coating solution in the manner of the so-called one continuous writing stroke, and a developing unit 18 for performing developing treatment on the wafer W after exposure are two-tiered from the bottom in order. Similarly in the second processing unit group G2, a resist coating unit 19 and a developing unit 20 are two-tiered from the bottom in order.

In the third processing unit group G3, for example as shown in FIG. 3, a cooling unit 30 for performing cooling processing on the wafer W, an adhesion unit 31 for enhancing adhesion properties of the resist solution and the wafer W, the extension unit 32 for delivering the wafer W, solvent atmosphere units 33, 34 for exposing the wafer W to a solvent atmosphere of a prescribed concentration, reduced-pressure drying units 35, 36 for subjecting the wafer W to reduced-pressure drying are, for example, seven-tiered from the bottom in order.

In the fourth processing unit group G4, for example, a cooling unit 40, an extension and cooling unit 41 for naturally cooling the mounted wafer W, an extension unit 42, a cooling unit 43, post-exposure baking units 44, 45 for performing baking processing after exposure, post-baking units 46, 47 for performing baking processing after developing treatment, and the like are, for example, eight tiered from the bottom in order.

A wafer carrier 50 is provided in the center part of the interface section 4. This wafer carrier 50 is structured to be movable in the X direction (in the top and bottom direction in FIG. 1) and the Z direction (vertical direction), and to be rotatable in a θ direction (rotating direction around a Z axis), and to be able to get access to the extension and cooling unit 41, the extension unit 42, a peripheral exposure unit 51 and a not-shown exposure unit which belong to the fourth processing unit group G4, and to carry the wafer W to each of them.

Figure 4:
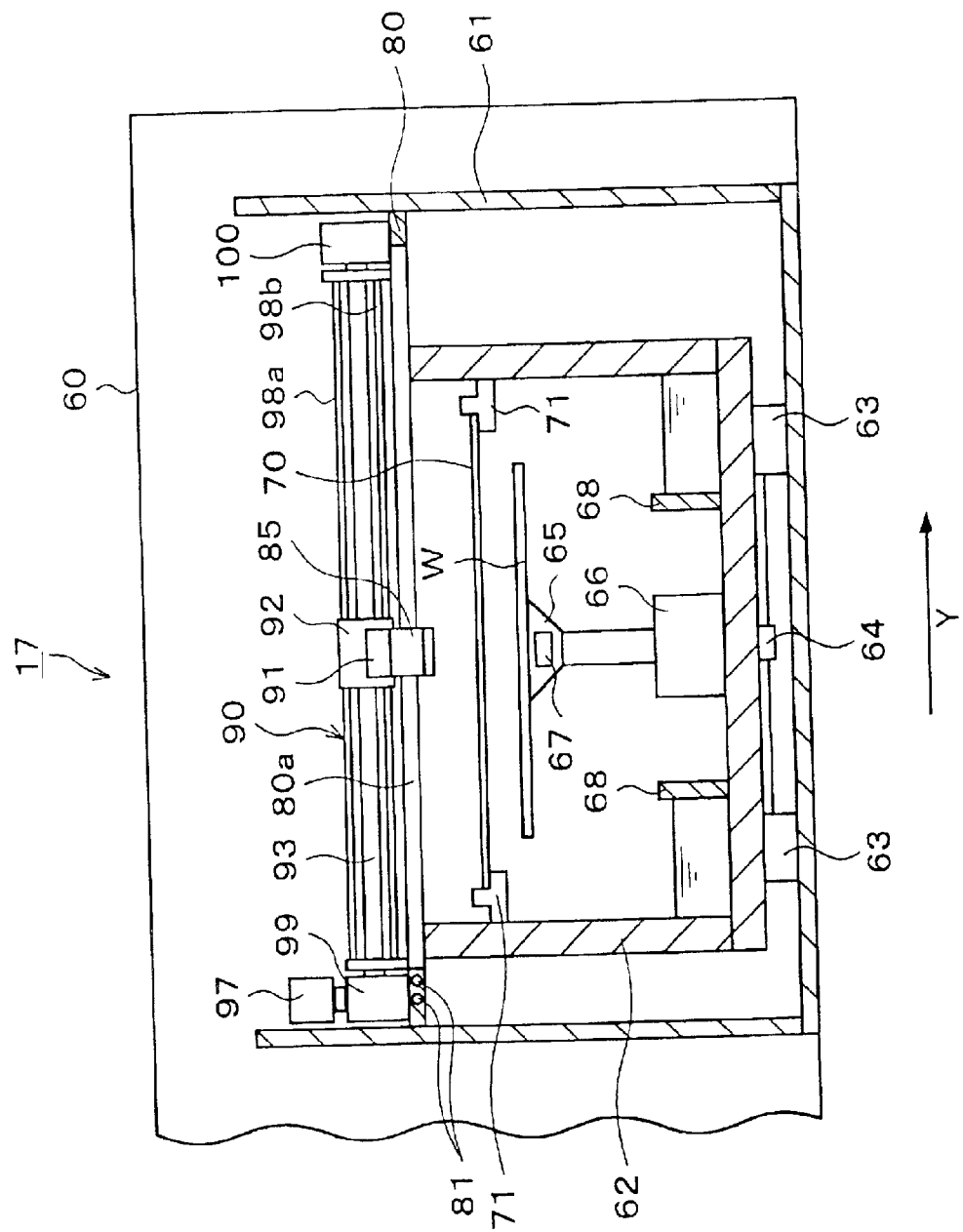
FIG. 4 is an explanatory view of a vertical section showing the structure of a resist coating unit mounted on the coating and developing system.

Next, an explanation about the structure of the aforementioned resist coating unit 17 will be given. FIG. 4 is an explanatory view of a vertical section showing the structure of the resist coating unit 17, and FIG. 5 is an explanatory view of a horizontal section showing the structure of the resist coating unit 17.

Figure 5:
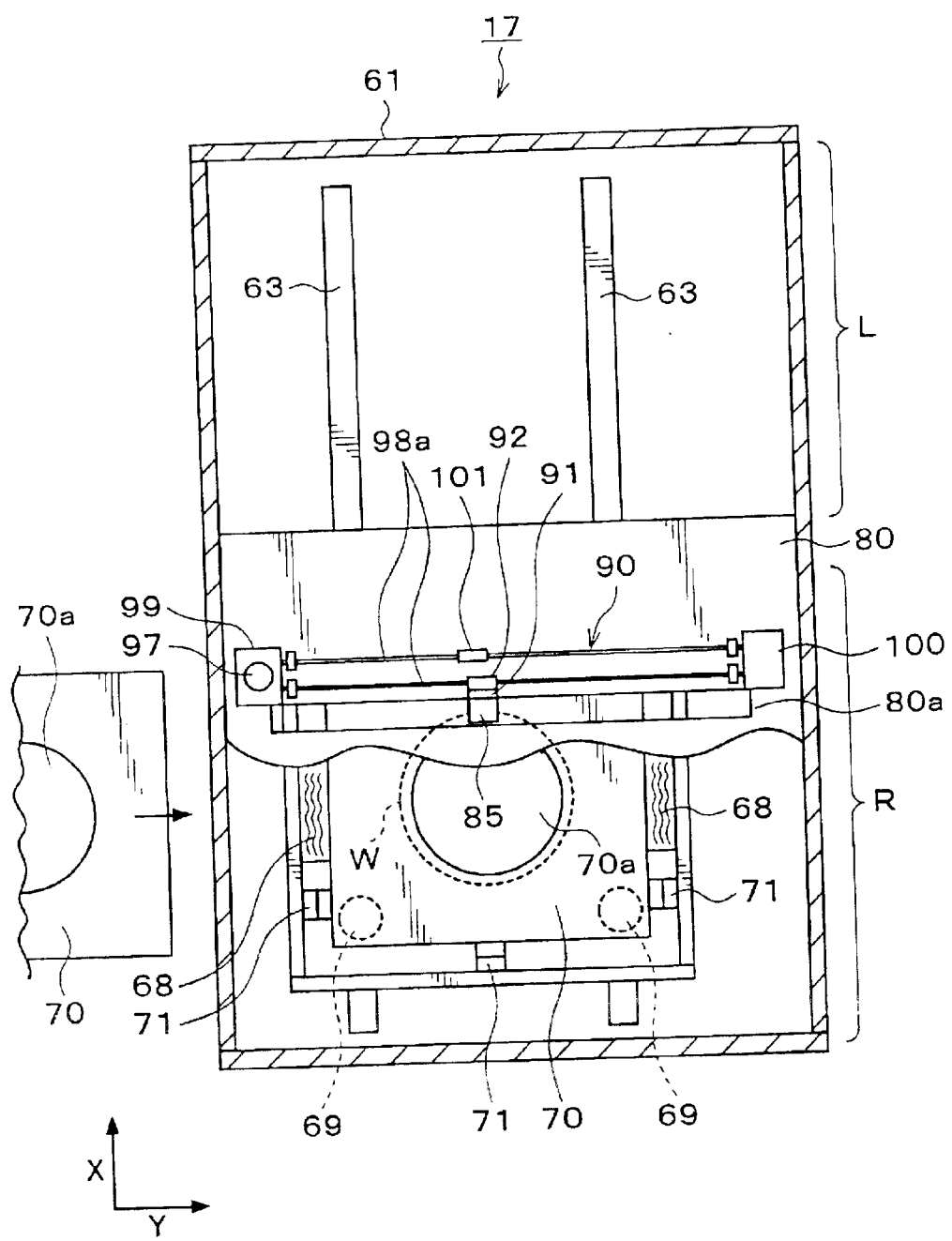
FIG. 5 is an explanatory view of a horizontal section of the resist coating unit in FIG. 4.

Inside a casing 60 of the resist coating unit 17, as shown in FIG. 4 and FIG. 5, a substantially box-shaped outer container 61, whose length is large in the X direction (in the top and bottom direction in FIG. 5) and whose top is open, is provided. Inside the outer container 61, an inner container 62 of a substantial box shape whose top is open and in which coating treatment on the wafer W is performed is provided.

The inner container 62 is provided to be movable along two rails 63 which extend in the X direction, and an inner container drive section 64 which includes a motor or the like for controlling movement of the inner container 62 is provided underneath the inner container 62. Thereby, the inner container 62 can move to a transporting zone L on a positive direction side of the X direction (upper side of FIG. 5) of the outer container 61 in carrying the wafer W into/out of the inner container 62, and move to a processing zone R on a negative direction side of the X direction (lower side of FIG. 5) in performing the coating treatment on the wafer W. Further, it is also possible to move the inner container 62 in the X direction by a predetermined distance at given timing in coating the wafer W with the resist solution, and hence the inner container drive section 64 comprises a moving mechanism of the present invention.

A holding table 65 for sucking and holding the wafer W is provided inside the inner container 62. Underneath the holding table 65, a rotary drive mechanism 66 which includes a motor or the like for allowing the holding table 65 to be rotatable is provided. Thereby, it is possible to rotate the wafer W which is held on the holding table 65 and to perform its alignment. An ultrasonic vibrator 67, for example, is attached to the holding table 65, which can vibrate the holding table 65 at high frequency. At the bottom of the inner container 62, a solvent tank 68 in which a solvent for keeping a solvent atmosphere inside the inner container 62 to be a prescribed concentration is pooled is provided.

At the bottom of the inner container 62, as shown in FIG. 5, exhaust holes 69 are formed so as to keep the solvent atmosphere near the wafer W to be a prescribed concentration by exhausting the atmosphere inside the inner container 62 from the exhaust holes 69.

In a not-shown cleaning zone which is outside the outer container 61, for example, on a negative direction side of a Y direction (left direction of FIG. 5), a mask member 70 which covers over the wafer W during coating to limit coating area of the wafer W is on standby. The mask member 70 has an opening 70a in its center part, which corresponds to the coating area. The opening 70a is formed, for example, in a round shape, and its diameter is slightly smaller than a diameter of the wafer W.

The mask member 70 is structured to be movable over to the wafer W inside the inner container 62 by a not-shown carrier mechanism. At an inner wall of the inner container 62, a mask supporting member 71 for supporting the mask member 70 above the wafer W is provided. Hence, it is possible to allow the mask member 70 to be on standby in the cleaning zone which is on the negative direction side of the Y direction of the outer container 61 (left direction of FIG. 5) at first and, after the inner container 62 having the wafer W moves to the processing zone R, to move the mask member 70 onto the mask supporting member 71 inside the inner container 62 by the not-shown carrier mechanism.

A lid 80 for covering the top of the outer container 61 on the processing zone R side is fixedly attached to the above-described outer container 61. Thereby, when the inner container 62 moves to the processing zone R side, its top is covered by the lid 80, and hence it is easy to keep the atmosphere inside the inner container 62. A heater 81 whose temperature can be adjusted is embedded in the lid 80, thereby preventing the solvent in the solvent tank 68 from causing condensation on the lower surface of the lid 80. A slit 80a which extends in the X direction is provided in the lid 80. Thereby, a discharge nozzle 85 as a later-described coating solution discharge nozzle moves inside the slit 80a to discharge the resist solution from the lid 80 above toward the wafer W.

Figure 6:
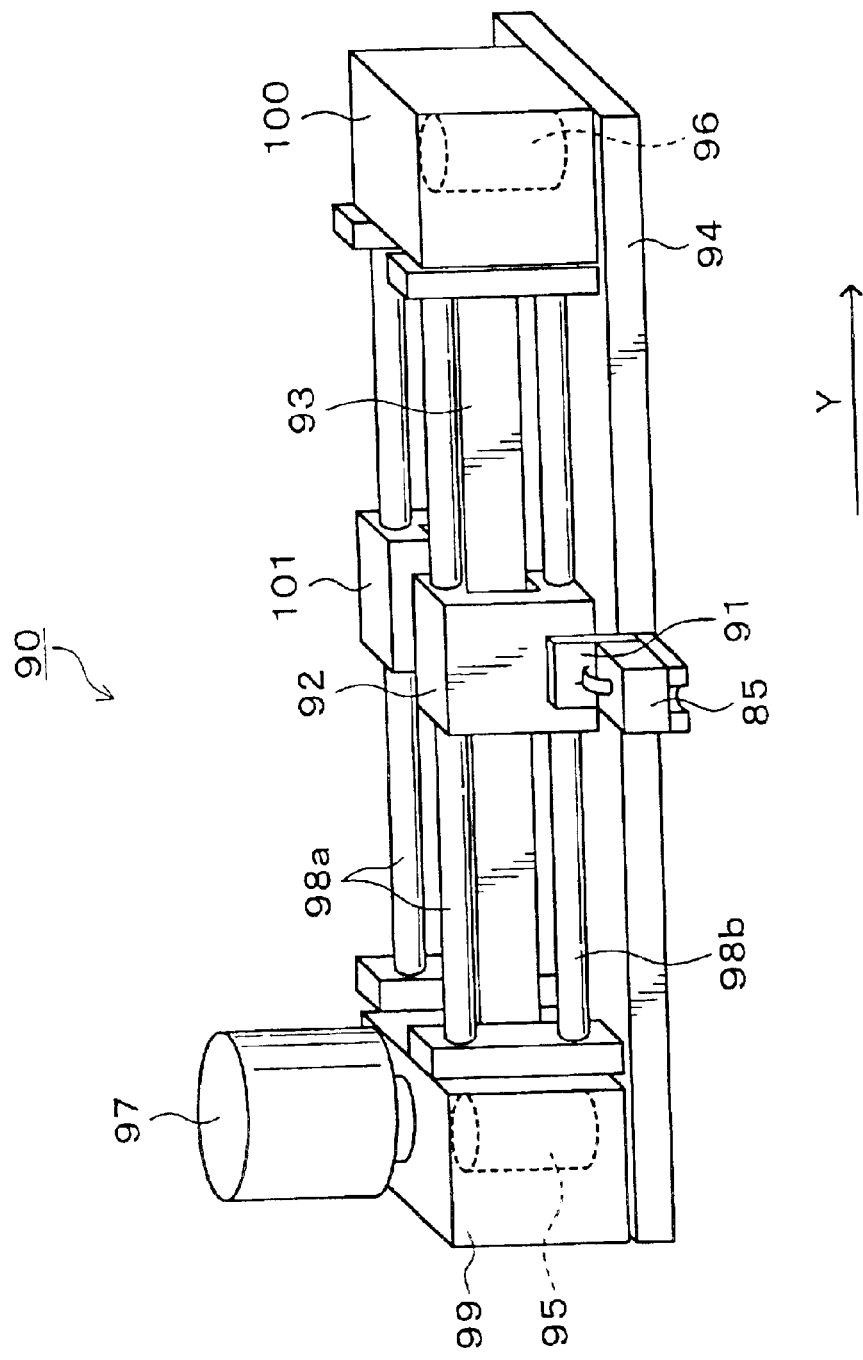
FIG. 6 is a perspective view showing the structure of a nozzle moving mechanism of a discharge nozzle.

The discharge nozzle 85 which discharges the resist solution onto the wafer W is structured to be freely movable over the wafer W in the Y direction by a nozzle moving mechanism 90 shown in FIG. 6. The nozzle moving mechanism 90 has a holder 91 for fixing the discharge nozzle 85, and the holder 91 is attached to a slider 92. The slider 92 is fixedly provided to a part of a driving belt 93 extending in the Y direction. The driving belt 93 is looped between a driving pulley 95 and an idler pulley 96 which are provided on a base plate 94 installed on the lid 80. The driving pulley 95 is rotated normally and inversely by a rotary drive motor 97. Being thus structured, the driving pulley 95 is rotated by the rotary drive motor 97 to move the driving belt 93 and to slide the slider 92 in the Y direction, so that the discharge nozzle 85 can reciprocate in the slit 80a of the lid 80.

The nozzle moving mechanism 90 includes guide shafts 98a and 98b which prevent the slider 92 from rocking while the slider 92 is moving. The guide shafts 98a and 98b are provided above and underneath the driving belt 93 in parallel, penetrate through the slider 92 to be coupled to brackets 99 and 100 of the driving pulley 95 and the idler pulley 96. There are not-shown spaces between contact surfaces of the slider 92 and the guide shafts 98a and 98b, through which air can be supplied. By supplying the air through the spaces, contact resistance between the slider 92 and the guide shafts 98a and 98b is reduced so that the slider 92 can slide smoothly.

A balance weight 101 whose weight is balanced with the slider 92 is provided to the driving belt 93 on a side without holding the discharge nozzle 85, whereby the rocking generated while the slider 92 is moving can be reduced to a minimum.

According to the above structure, the discharge nozzle 85 above the wafer W discharges the resist solution onto the wafer W while moving in the Y direction and the inner container 62 moves in the Y direction intermittently, whereby the entire wafer W can be with the resist solution in the manner of the so-called one continuous writing stroke. Incidentally, according to this embodiment, a moving mechanism for relatively moving the wafer W and the discharge nozzle 85 consists of the inner container drive section 64 and the nozzle moving mechanism 90.

Figure 7:
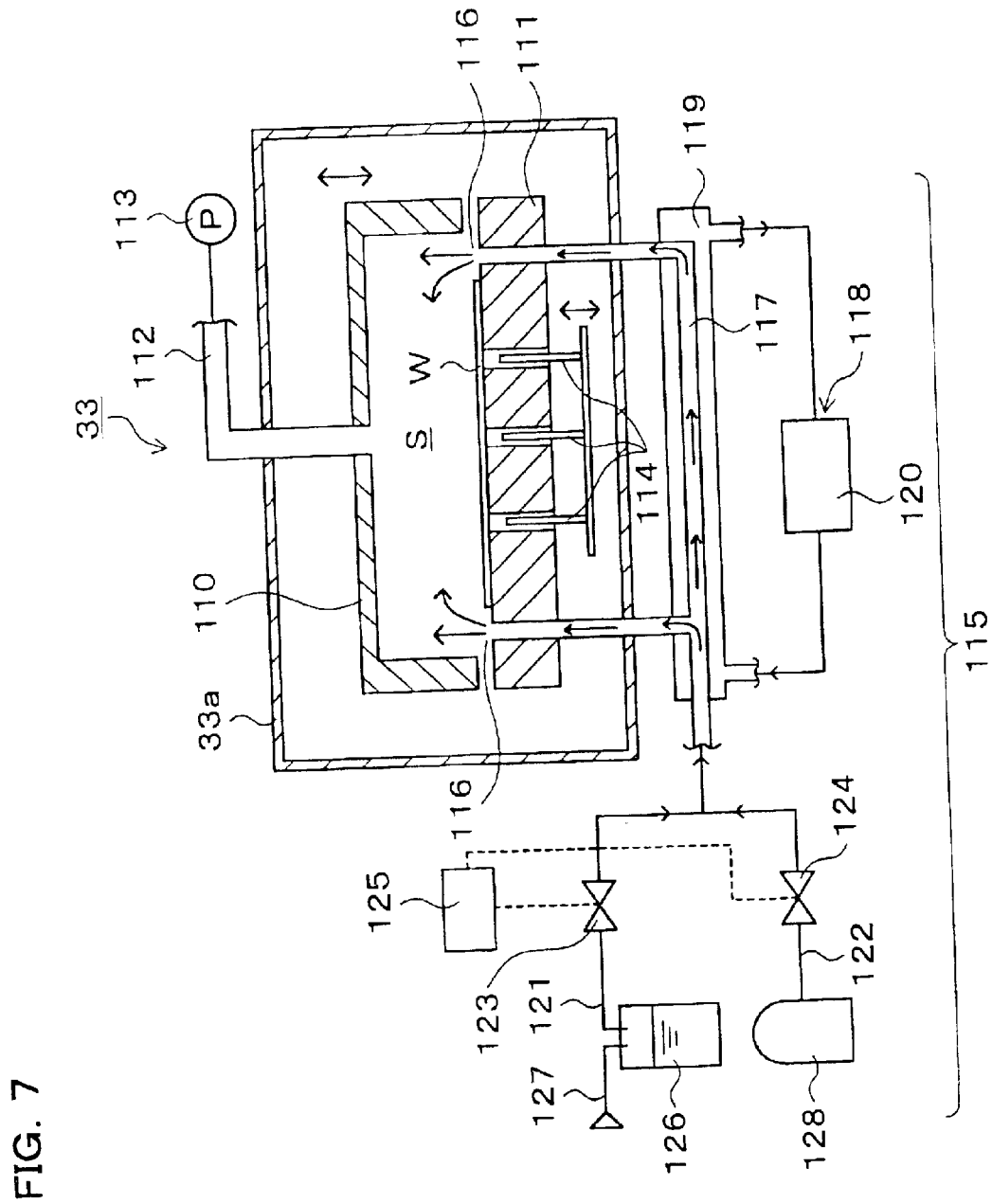
FIG. 7 is an explanatory view of a vertical section showing the structure of a solvent atmosphere unit mounted on the coating and developing system.

Next, an explanation about the above-described solvent atmosphere unit 33 will be given. FIG. 7 is an explanatory view of a vertical section showing an outline of the structure of the solvent atmosphere unit 33.

The solvent atmosphere unit 33 includes a lid body 110 which is placed at the upper part and is movable vertically and a mounting table 111 which is placed at the lower part and is for mounting the wafer W in a casing 33a. The lid body 110 has a substantial cylindrical shape whose top is closed and bottom is open, and the mounting table 111 is thick and is substantially disc-shaped. An outer shape of the mounting table 111 is formed to be larger than an outer shape of the lid body 110 and, when the lid body 110 descends, the lid body 110 and the mounting table 111 integrally form a processing chamber S as a chamber which can hold the wafer W in a prescribed atmosphere. In order to strictly control the atmosphere inside the processing chamber S, it is suitable to provide an O-ring and the like at the lower end part of the lid body 110. The lid body 110 is vertically movable by a not-shown hoisting and lowering mechanism which includes a cylinder and the like.

At the center part of the upper surface of the lid body 110, an exhaust pipe 112 is provided for exhausting the atmosphere inside the processing chamber S. The exhaust pipe 112 is connected to, for example, a suction pump 113 and, when the suction pump 113 operates, the solvent atmosphere filled inside the processing chamber S is exhausted as will be described later, thereby purging inside the processing chamber S.

Hoisting and lowering pins 114 which are capable of protruding through the upper surface of the mounting table 111 and hoisting and lowering the wafer W are provided to the mounting table 111. Thereby, the wafer W is made to be freely mounted on the mounting table 111.

The solvent atmosphere unit 33 includes a solvent vapor supply mechanism 115 for supplying a solvent vapor of the resist solution of a prescribed concentration to the processing chamber S. Hereinafter, an explanation about the solvent vapor supply mechanism 115 will be given.

The solvent vapor supply mechanism 115 includes a supply pipe 117 which forms a plurality of supply ports 116 on the upper surface of the mounting table 111 to communicate with the processing chamber S.

A temperature controller 118 is provided to a part of the supply pipe 117, which controls temperature of the solvent vapor of the prescribed concentration flowing through the supply pipe 117 to predetermined temperature. The temperature controller 118 includes, for example, a pipe line 119 which covers an outer periphery of the supply pipe 117 and through which a temperature-controlled heat exchange fluid can be circulated and a supply section 120 which supplies the temperature-controlled heat exchange fluid such as constant temperature water to the pipe line 119. Thereby, the heat exchange fluid at predetermined temperature is supplied from the supply section 120 into the pipe line 119 to conduct heat from the pipe line 119 to the supply pipe 117, so that the temperature of the solvent vapor which passes through the supply pipe 117 can be controlled to the predetermined temperature.

An upstream part of the supply pipe 117 is branched to a solvent vapor supply pipe 121 which supplies the solvent vapor of the resist solution to the supply pipe 117 and a gas supply pipe 122 which supplies a carrier gas of the solvent vapor such as a nitrogen gas.

A first adjustment valve 123 which adjusts flow volume of the solvent vapor flowing though the solvent vapor supply pipe 121 is provided to the solvent vapor supply pipe 121. A second adjustment valve 124 which adjusts flow volume of the carrier gas is also provided to the gas supply pipe 122. Thus, a mixing ratio of the solvent vapor and the carrier gas which flow into the supply pipe 117 is adjusted, and the concentration of the solvent vapor supplied into the processing chamber S is adjusted to the prescribed concentration. Opening and closing extents of the first adjustment valve 123 and the second adjustment valve 124 are controlled by a control section 125 so that the concentration of the solvent vapor becomes the set concentration.

The solvent vapor supply pipe 121 is communicated with the upper part of a tank 126 as a solvent supply source, in which a liquefied solvent is pooled. An air supply pipe 127 which supplies air such as a nitrogen gas and an inert gas to a gas phase region of the tank 126 is provided to the upper part of the tank 126. By thus supplying the air from the air supply pipe 127, the solvent vapor evaporated in the tank 126 is forcedly fed so that the solvent vapor flows from the tank 126 into the solvent vapor supply pipe 121. The gas supply pipe 122 is communicated with, for example, a gas tank 128 at high pressure as a supply source of the carrier gas.

According to this example, the supply pipe 117, the solvent vapor supply pipe 121, the gas supply pipe 122, the first adjustment valve 123, the second adjustment valve 124, the control section 125, the tank 126 and the gas tank 128 compose the solvent vapor supply mechanism 115.

Figure 8:
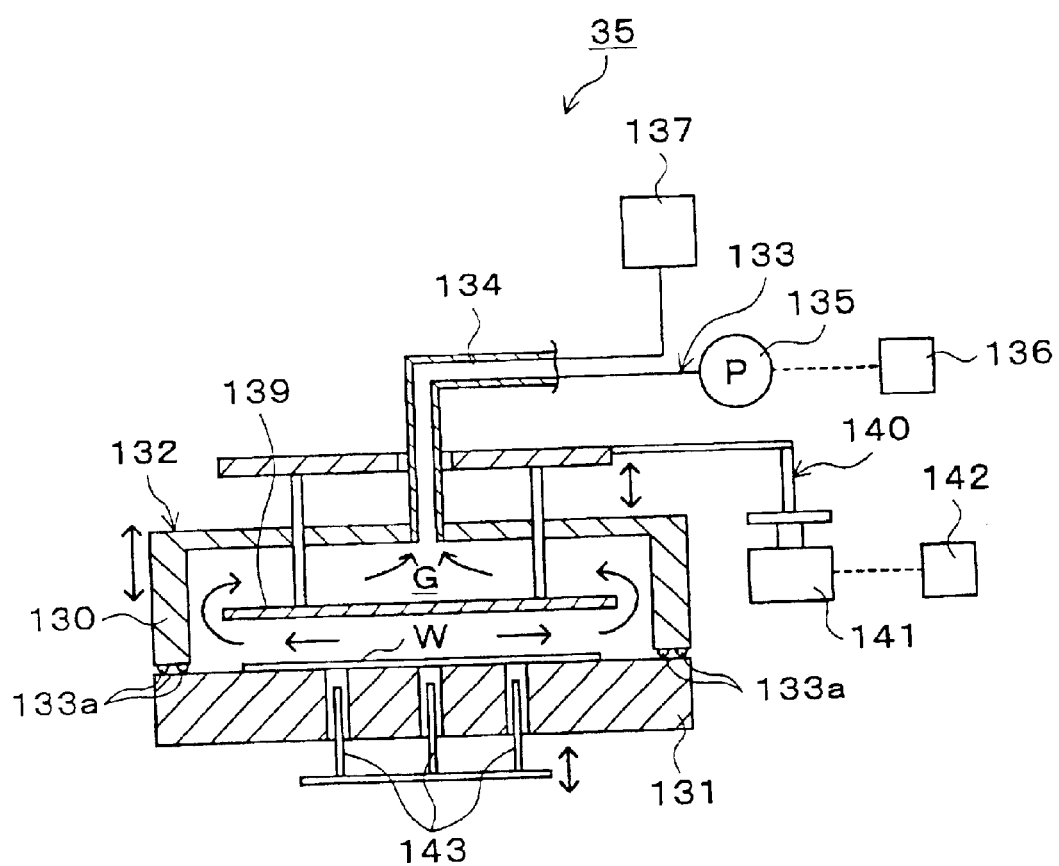
FIG. 8 is an explanatory view of a vertical section showing the structure of a reduced-pressure drying unit mounted on the coating and developing system.

Next, an explanation about the above-described reduced-pressure drying unit 35 will be given. As shown in FIG. 8, the reduced-pressure drying unit 35 includes, for example, a lid body 130 which is movable vertically and has a substantial cylindrical shape whose bottom is open, and a mounting section 131 which is placed underneath the lid body 130 and is for mounting the wafer W. The mounting section 131 is thick and is substantially disc-shaped. An outer shape of the lid body 130 is formed to be smaller than an outer shape of the mounting section 131 and, when the lid body 130 descends, the lower end part of the lid body 130 and the mounting section 131 are brought into close contact with each other to form a container 132 for housing the wafer W. At the lower end part of the lid body, two O-rings 130a are provided on its outer side and its inner side in order to make inside the container 132 airtight, and the inside of the container 132 is used as a pressure reducing chamber G. Incidentally, the lid body 130 is movable vertically by, for example, a lid-body drive mechanism in which a motor or the like is embedded (illustration is omitted).

The reduced-pressure drying unit 35 includes a pressure reducing mechanism 133 for reducing pressure inside the container 132. The pressure reducing mechanism 133 includes an exhaust pipe 134 for exhausting an atmosphere in the container 132, a vacuum pump 135 which is connected to the exhaust pipe 134 and is for sucking the atmosphere in the container 132 at predetermined pressure, and a pump control section 136 for controlling the vacuum pump 135. The exhaust pipe 134 is attached to the center part of the upper surface of the lid body 130. Thereby, by operating the vacuum pump 135 whose suction pressure is controlled by the pump control section 136, the atmosphere in the container 132 is sucked and the pressure inside the container 132 is reduced, so that airflow can be formed inside the container 132.

A supply section 137 for supplying air into the container 132 through the exhaust pipe 134 is connected to the exhaust pipe 134. Thus, by supplying the air into the container 132 after reduced-pressure drying processing, the reduced pressure state can be recovered and the atmosphere inside the container 132 can be purged.

A current plate 139 for controlling a direction of the airflow which is generated while reducing the pressure is provided inside the lid body 130 and above the mounting section 131. The current plate 139 has, for example, a thin disc shape, and is formed so that its surface facing the wafer W is in parallel to the wafer W.

The current plate 139 includes a hoisting and lowering mechanism 140 which allows the current plate 139 to be movable vertically. The hoisting and lowering mechanism 140 includes, for example, a drive section 141 of a cylinder or the like and a hoisting and lowering control section 142 for controlling driving of the drive section 141. Thereby, it is possible to move the current plate 139 vertically at given timing, and to adjust a distance between the current plate 139 and the wafer W.

Hoisting and lowering pins 143 which are capable of protruding through the upper surface of the mounting section 131 and hoisting and lowering the wafer W freely are provided to the mounting section 131. Thereby, the wafer W is made to be freely mounted on the mounting section 131.

Next, an explanation about wafer processing which is performed in thus-structured coating and developing system 1 will be given.

First, the wafer carrier 7 removes one wafer W which is not processed from the cassette C and carries it into the extension unit 32 which belongs to the third processing unit group G3. Then, the wafer W is carried into the adhesion unit 31 by the main carrier unit 13 and, for example, HMDS for enhancing an adhesion property with the resist solution is coated on the wafer W. Next, the wafer W is carried into the cooling unit 30 to be cooled to predetermined temperature. Thereafter, the wafer W which is cooled to the predetermined temperature is carried into the resist coating unit 17 or 19 by the main carrier unit 13.

The operation of the resist coating unit 17 will be explained in detail. First, the wafer W is carried into the casing 60 of the resist coating unit 17 by the main carrier unit 13. At this time, the inner container 62 is already on standby in the transporting zone L, and the wafer W is directly mounted on the holding table 65 by the main carrier unit 13 to be sucked and held. Then, the rotary drive mechanism 66 detects a notch or orientation flat of the wafer W by a not-shown alignment mechanism, and the wafer W is aligned at a predetermined position. Next, the inner container 62 is moved to the processing zone R by the inner container drive section 64. Thereafter, the mask member 70 which has been on standby in the not-shown cleaning zone is carried from the outside of the outer container 61 to the inside of the inner container 62 to be mounted on the mask supporting member 71.

Next, the atmosphere inside the inner container 62 is exhausted from the exhaust holes 69 so as to keep the prescribed solvent atmosphere inside the inner container 62. Then, the discharge nozzle 85 is moved by the nozzle moving mechanism 90 to a predetermined position above the wafer W, that is, a START position at which the coating is started, and the resist solution is coated in the manner of the so-called one continuous writing stroke. Incidentally, a resist solution having high viscosity, for example, 0.005 to 0.030 Pa·s, is used in order to reduce an edge cutting width.

Figure 9:
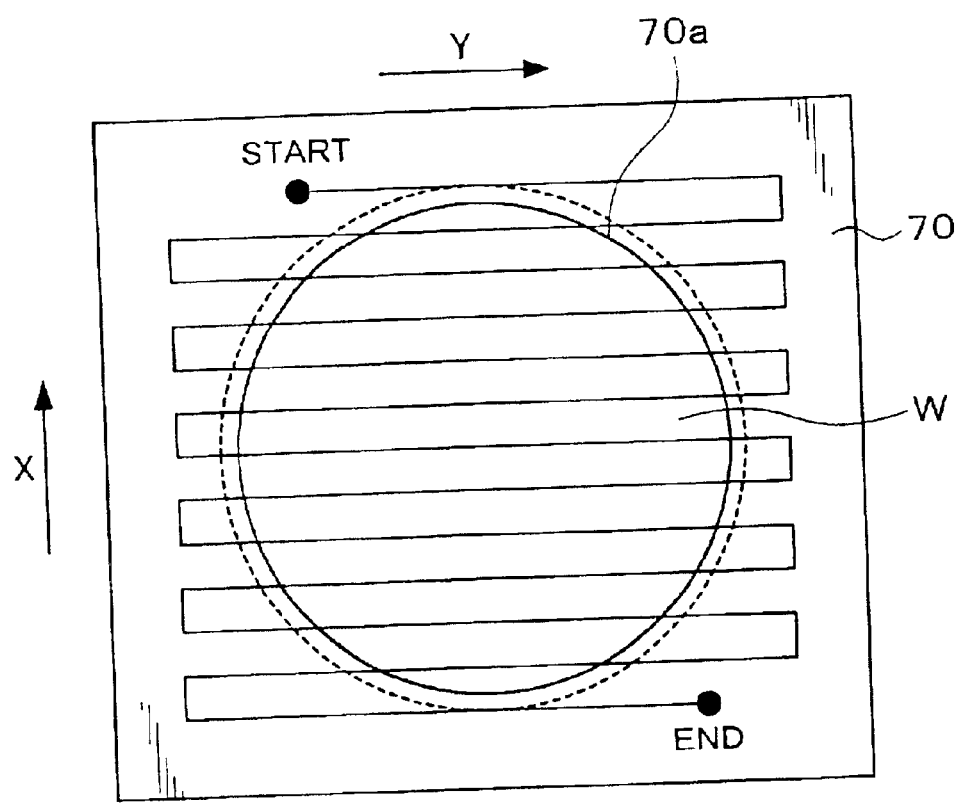
FIG. 9 is an explanatory view showing a coating path of a resist solution in plane.

An example of a coating path over which the resist solution is coated will be explained. As shown in FIG. 9, for example, the discharge nozzle 85 first discharges the resist solution onto the wafer W while moving from the START position toward the positive direction of the Y direction (right direction in FIG. 9) at a predetermined rate. The discharge nozzle 85 proceeds over a longer distance than the diameter of the wafer W, that is, it proceeds up to a position outside the end part of the wafer W, and stops temporarily above the mask member 70. The resist solution continues to be discharged all the while, and the resist solution which is discharged outside the wafer W is received by the mask member 70 and wasted. Then, the inner container 62 is shifted in the X direction by a predetermined distance by the inner container drive section 64, and the wafer W is also shifted in the X direction. Thereafter, the discharge nozzle 85 turns back and moves to the negative direction of the Y direction, proceeds up to a position outside the wafer W and stops, while coating the resist solution continuously. Then, the wafer W is shifted in the X direction by a predetermined distance, and the discharge nozzle 85 turns back again to coat the resist solution onto the wafer W.

The above treatment is repeated and, when the discharge nozzle 85 comes to an END position shown in FIG. 9, the discharge is stopped and the coating is completed. Thereby, the path of the discharge nozzle 85 becomes the one shown in FIG. 9, and thus the resist solution is coated on the entire wafer W in the manner of the so-called one continuous writing stroke.

Figure 10:
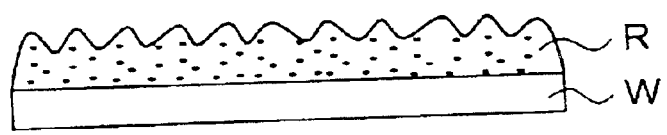
FIG. 10 is an explanatory view showing a state of a resist film on a wafer after resist coating is performed.
Figure 11:
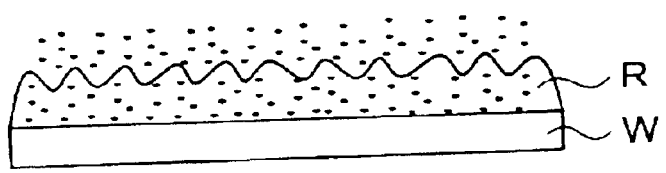
FIG. 11 is an explanatory view showing a state of the resist film on the wafer when the wafer is exposed to a solvent vapor.

After the resist solution is coated on the wafer W, the ultrasonic vibrator 67 which is attached to the holding table 65 vibrates the wafer W, thereby smoothing and flattening the resist solution on the wafer W to form a resist film R on the wafer W However, since the resist solution having high viscosity is used according to this embodiment, the resist solution is not smoothed enough and unevenness is caused on the surface of the resist film R, as shown in FIG. 10.

When the coating of the resist solution is completed, the mask member 70 is carried out of the outer container 61 by the not-shown carrier mechanism, and after that, the inner container 62 is moved by the inner container drive section 64 to the transporting zone L. Then, the wafer W is carried out of the casing 60 by the main carrier unit 13 to be carried into the solvent atmosphere unit 33.

Next, the operation of the solvent atmosphere unit 33 will be explained. The wafer W, on which the resist film R is formed, is carried by the main carrier unit 13 into the casing 33a. At this time, the lid body 110 is hoisted by a not-shown lid hoisting and lowering mechanism, and the wafer W is delivered to the hoisting and lowering pins 114 which are hoisted in advance and are on standby. Then, the wafer W is mounted on the mounting table 111, and the lid body 110 descends to form the processing chamber S.

Then, the solvent vapor supply mechanism 115 operates to start the supply of the solvent vapor of the prescribed concentration into the processing chamber S. At this time, the first adjustment valve 123 and the second adjustment valve 124 are respectively opened according to the opening and closing extents controlled by the control section 125, and the solvent vapor of predetermined flow volume is supplied from the tank 126 at high pressure to the solvent vapor supply pipe 121 and the nitrogen gas of predetermined flow volume is supplied from the gas tank 128 at high pressure to the gas supply pipe 122, respectively.

Next, the solvent vapor from the solvent vapor supply pipe 121 and the nitrogen gas from the gas supply pipe 122 are mixed in the supply pipe 117 according to a prescribed mixing ratio to become a solvent vapor of a prescribed concentration, for example, a solvent vapor whose concentration is 10%, which is supplied into the processing chamber S. At this time, in the supply pipe 117, the temperature of the solvent vapor is controlled to predetermined temperature, for example, to room temperature by the temperature controller 118. Thereby, the atmosphere inside the processing chamber S is replaced by the solvent atmosphere which is at the room temperature and whose concentration is 10%. Then, the wafer W is exposed to this solvent atmosphere for a predetermined time, for example, for one minute. At this time, the solvent vapor comes in contact with the surface of the resist film R shown in FIG. 1, whereby the viscosity of the surface of the resist film R is decreased and the surface thereof is softened.

After the predetermined time, the first adjustment valve 123 and the second adjustment valve 124 are closed and the supply of the solvent vapor is stopped. The suction pump 113 is operated to exhaust the solvent atmosphere inside the processing chamber S from the exhaust pipe 112. Next, the lid body 110 ascends again to open the processing chamber S. Then, the wafer W is hoisted by the hoisting and lowering pins 114 to be delivered to the main carrier unit 13 and carried out of the solvent atmosphere unit 33. Subsequently, the wafer W is carried into the reduced-pressure drying unit 35 in which the reduced-pressure drying processing is performed.

An explanation about the operation of the reduced-pressure drying unit 35 will be given. First, the wafer W, whose surface of the resist film R is softened in the solvent atmosphere unit 33, is carried into the reduced-pressure drying unit 35. At this time, the lid body 130 has been hoisted by the not-shown lid body drive mechanism, and the wafer W is delivered to the hoisting and lowering pins 143 which are ascended above the mounting section 131 and are on standby in advance. Then, the hoisting and lowering pins 143 descend and the wafer W is mounted on the mounting section 131.

Then, the lid body 130 descends and the lower end part of the lid body 130 and the upper surface of the mounting section 131 are brought into close contact with each other to form the container 132 and the pressure reducing chamber G. At this time, the current plate 139 is lowered by the hoisting and lowering mechanism 140 so that the current plate 139 comes closer to the surface of the wafer W.

Figure 12:
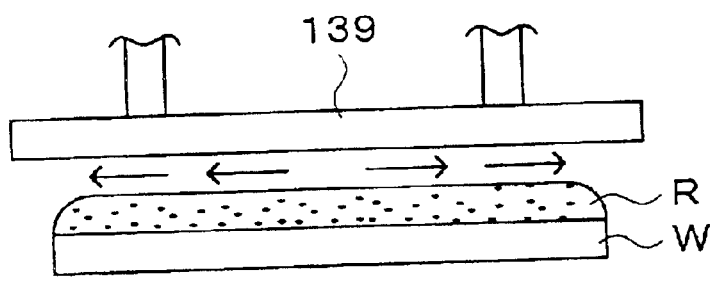
FIG. 12 is an explanatory view showing a state of the resist film of the wafer when the wafer is subjected to reduced-pressure drying.

Thereafter, the vacuum pump 135 of the pressure reducing mechanism 133 is operated, and the atmosphere inside the pressure reducing chamber G is started to be sucked at predetermined pressure, for example, 0.013 KPa. Accordingly, the airflow is formed inside the pressure reducing chamber G and, as shown in FIG. 12, the strong airflow from the center part of the wafer W toward the peripheral edge part is formed above the upper surface of the wafer W. Thereby, the surface layer of the resist film R on the surface of the wafer W is smoothed and flattened. Further, by thus reducing the pressure, the solvent in the resist film R is evaporated and the resist film R is dried.

Thereafter, after performing the reduced-pressure drying processing for a predetermined time, the vacuum pump 135 is stopped and the pressure reducing of the pressure reducing chamber G is terminated. Next, the nitrogen gas, for example, is supplied from the supply section 137 through the exhaust pipe 134 into the pressure reducing chamber G, thereby recovering the pressure inside the pressure reducing chamber G. Thereafter, when the pressure inside the pressure reducing chamber G is recovered up to atmospheric pressure, the supply of the nitrogen gas is stopped and then, the lid body 130 is hoisted to open the pressure reducing chamber G. Then, similarly to the case of carrying in the wafer W, the wafer W is delivered from the hoisting and lowering pins 143 to the main carrier unit 13 to be carried out of the reduced-pressure drying unit 35.

After the reduced pressure drying processing, the wafer W is carried into the extension and cooling unit 41 and subsequently, carried into the peripheral exposure unit 51 and the exposure unit (not shown) in due order by the wafer carrier 50. After the exposure processing, the wafer W is carried into the extension unit 42 by the wafer carrier 50 and subsequently, carried into the post-exposure baking unit 44 or 45 and the cooling unit 40 by the main carrier unit 13 in due order to undergo predetermined processing in the respective processing units, and thereafter, carried into the developing unit 18 or 20.

After the developing treatment, the wafer W is carried into the post-baking unit 46 or 47 and the cooling unit 43 in due order by the main carrier unit 13 to undergo predetermined processing in the respective processing units. Thereafter, the wafer W is returned back to the cassette C by the wafer carrier 7 through the extension unit 32, and thus the predetermined process of coating and developing completes.

According to the above-described embodiment, the resist coating unit 17 for coating the resist solution in the manner of the so-called one continuous writing stroke, the solvent atmosphere unit 33 for exposing the wafer W to the solvent atmosphere of the prescribed concentration, and the reduced-pressure drying unit 35 for reducing pressure and drying the wafer W are provided in the coating and developing system 1. Hence, after coating the resist solution in the manner of the so-called one continuous writing stroke, the wafer W is exposed to the solvent atmosphere to decrease the viscosity of the surface of the resist film R. Then, the wafer W whose viscosity of the surface of the resist film R is decreased is subjected to the reduced-pressure drying processing so as to flatten the surface of the resist film R. Thereby, even when the resist solution having relatively high viscosity is used in order to reduce the edge cutting width, it is possible to form the uniform resist film R having predetermined film thickness.

The control section 125 for adjusting the opening and closing extents of the first adjustment valve 123 and the second adjustment valve 124 to control the concentration of the solvent vapor is provided to the solvent vapor supply mechanism 115 of the solvent atmosphere unit 33. Hence, it is possible to supply the solvent vapor of the appropriate concentration into the processing chamber S and to supply the right amount of the solvent vapor to the resist film R on the wafer W. Thereby, only the surface of the resist film R on the wafer W can be softened properly. Additionally, since the temperature controller 118 is provided to the supply pipe 117, the temperature inside the processing chamber S which has the effect on the amount of evaporation of the solvent can be maintained appropriately, and the stable processing can be performed.

Since he current plate 139 is provided inside the reduced-pressure drying unit 35, the airflow in parallel to the surface of the wafer W is formed, and hence the resist film R on the wafer W can be flattened more efficiently. Since the hoisting and lowering mechanism 140 is provided for moving the current plate 139 vertically, it is possible to allow the current plate 139 to come closer to the wafer W during the reduced-pressure drying processing and to increase flow velocity of the airflow formed above the wafer W. Thereby, the resist film R is flattened more securely.

In the above-described embodiment, the processing of exposing the wafer W to the prescribed solvent atmosphere and the processing of reduced-pressure drying are preformed by using the two units of the solvent atmosphere unit 33 and the reduced-pressure drying unit 35, but it is suitable to perform these processing by using a unit which can perform both of these processing. In concrete, it is proposed that the function of supplying the solvent of the solvent atmosphere unit 33 is attached to the reduced-pressure drying unit 35. Hereinafter, this will be explained as a second embodiment.

Figure 13:
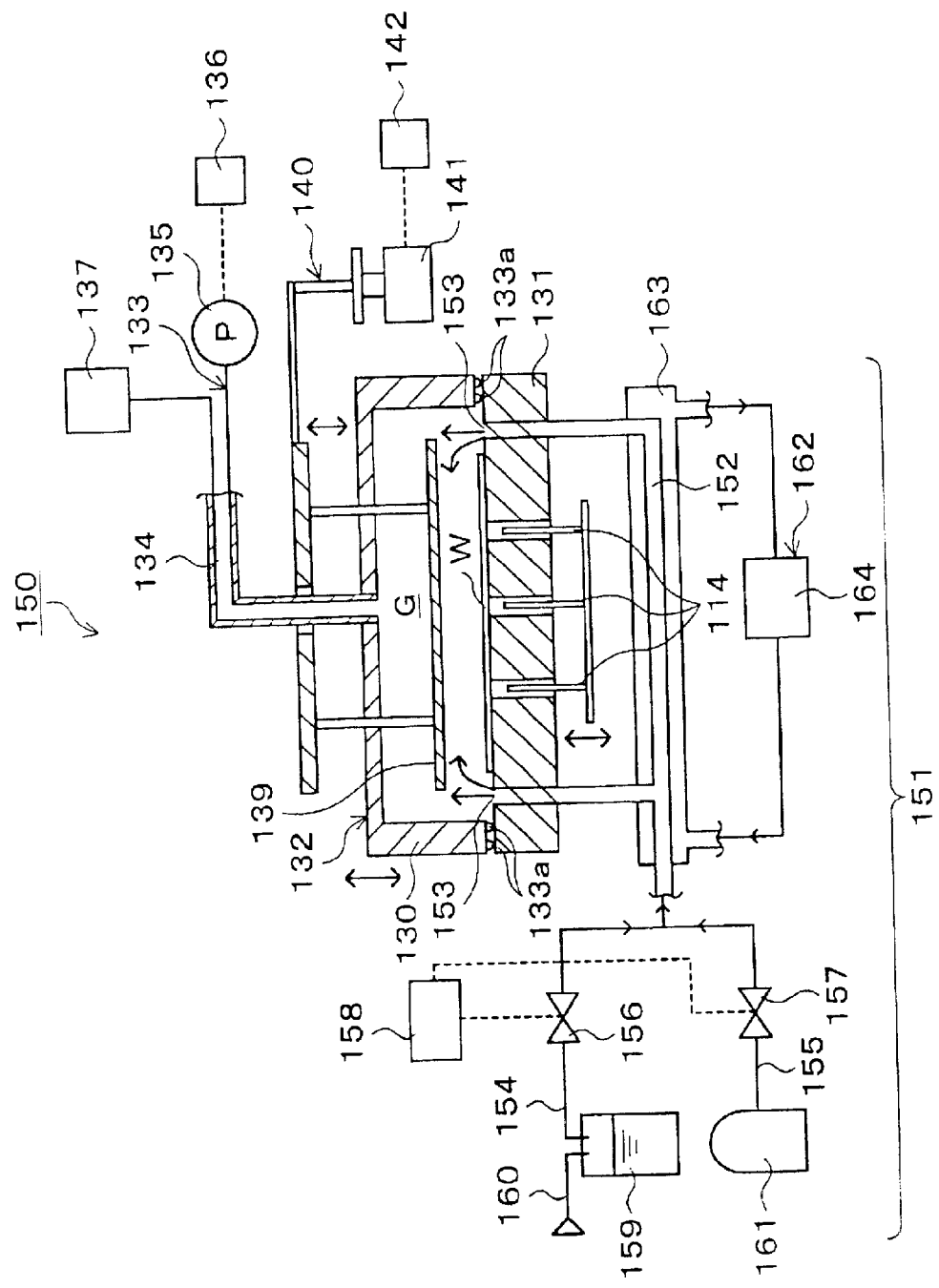
FIG. 13 is an explanatory view of a vertical section showing another structural example of the reduced-pressure drying unit.

In the second embodiment, for example as shown in FIG. 13, a solvent vapor supply mechanism 151 which has the same structure as that of the first embodiment is attached to a reduced-pressure drying unit 150. Namely, in the reduced-pressure drying unit 150, a supply pipe 152 for supplying a solvent vapor of a prescribed concentration into a container 132 is provided. The supply pipe 152 includes a plurality of supply holes 152 in the upper surface of a mounting section 131 so that the solvent vapor of the prescribed concentration can be blew upward from the upper surface of the mounting section 131.

An upstream part of the supply pipe 152 is branched to a solvent vapor supply pipe 154 which makes the solvent vapor flow from a solvent supply source into the supply pipe 152 and a gas supply pipe 155 which makes a carrier gas flow from a carrier gas supply source into the supply pipe 152. A first adjustment valve 156 is provided to the solvent vapor supply pipe 154, and a second adjustment valve 157 is provided to the gas supply pipe 155. Opening and closing extents of the first adjustment valve 156 and the second adjustment valve 157 are controlled by a control section 158.

A tank 159 in which the solvent is pooled is provided as the solvent supply source, and an air supply pipe 160 for forcedly feeding the solvent vapor inside the tank 159 to the solvent vapor supply pipe 154 is provided to the tank 159. A gas tank 161, for example, is provided as the carrier gas supply source. A temperature controller 162 is provided to the supply pipe 152, which controls temperature of the solvent flowing through the supply pipe 152. The temperature controller 162 includes, for example, a pipe line 163 which covers the supply pipe 152 and through which a heat exchange fluid such as constant temperature water can be circulated and a supply section 164 which supplies the temperature-controlled heat exchange fluid into the pipe line 163.

Incidentally, the structure other than the solvent vapor supply mechanism 152 is the same as that of the reduced-pressure drying unit 35 described in the first embodiment.

The operation of thus-structured reduced-pressure drying unit 150, to which solvent vapor supply mechanism 151 is attached, will be explained. First, as described in the first embodiment, the wafer W on which the resist solution is coated in the manner of the so-called one continuous writing stroke is carried by a main carrier unit 13 into the reduced-pressure drying unit 150. When the wafer W is mounted on the mounting section 131 by hoisting and lowering pins 114, a lid body 130 descends and the lid body 130 and the mounting section 131 integrally form the container 132, and a pressure reducing chamber G is formed inside the container 132.

Next, a current plate 139 is hoisted by a hoisting and lowering mechanism 140 to form a large space above the wafer W so that the solvent vapor flows therein easily. Then, the solvent vapor supply mechanism 151 is operated and the solvent vapor is started to be supplied into the container 132. At this time, the first adjustment valve 156 and the second adjustment valve 157 are controlled by the control section 158 and a solvent vapor of a prescribed concentration, for example, a solvent vapor whose concentration is 10%, is supplied thereto. Further, the temperature of the solvent vapor is controlled by the temperature controller 162 to become predetermined temperature, for example, room temperature such as 23 degrees centigrade.

Inside the container 132 is filled with the solvent vapor of the prescribed concentration, and the wafer W is exposed to this solvent atmosphere for a predetermined time, for example, for one minute. After one minute, the solvent vapor supply mechanism 151 is stopped and the supply of the solvent vapor is terminated. By the processing like this, the right amount of the solvent vapor adheres to the surface of the resist film R on the wafer W, and its viscosity decreases.

Next, the current plate 139 is lowered by the hoisting and lowering mechanism 140 so that it comes closer to the surface of the wafer W. Thereafter, similarly to the first embodiment, a vacuum pump 135 is operated and the atmosphere inside the pressure reducing chamber G is started to be sucked at prescribed pressure, for example, 0.013 KPa. Accordingly, airflow is formed inside the pressure reducing chamber G and, the strong airflow from the center part of the wafer W toward the peripheral edge part is formed above the upper surface of the wafer W. Thereby, the surface of the resist film R on the wafer W is flattened. Further, the solvent in the resist film R is evaporated and the resist film R is dried at the same time.

After performing the reduced-pressure drying processing for a predetermined time, the vacuum pump 135 is stopped and the pressure reducing of the pressure reducing chamber G is terminated. Next, the nitrogen gas, for example, is supplied from a supply section 137 into the pressure reducing chamber G, thereby recovering the pressure inside the pressure reducing chamber G of the container 132. Thereafter, when the pressure inside the pressure reducing chamber G is recovered up to atmospheric pressure, the supply of the nitrogen gas is stopped and then, the lid body 130 is hoisted to open the pressure reducing chamber G. Then, the wafer W is delivered from the hoisting and lowering pins 114 to the main carrier unit 13 to be carried out of the reduced-pressure drying unit 150.

According to this second embodiment, the processing of exposing the wafer W to the solvent atmosphere and the processing of performing the reduced-pressure drying on the wafer W can be preformed by one processing unit, and therefore time required for these processing can be shortened. Additionally, since the number of the processing units required for these processing can be reduced, it is possible to mount larger number of processing units in the coating and developing unit 1 so as to improve its processing capacity.

Figure 14:
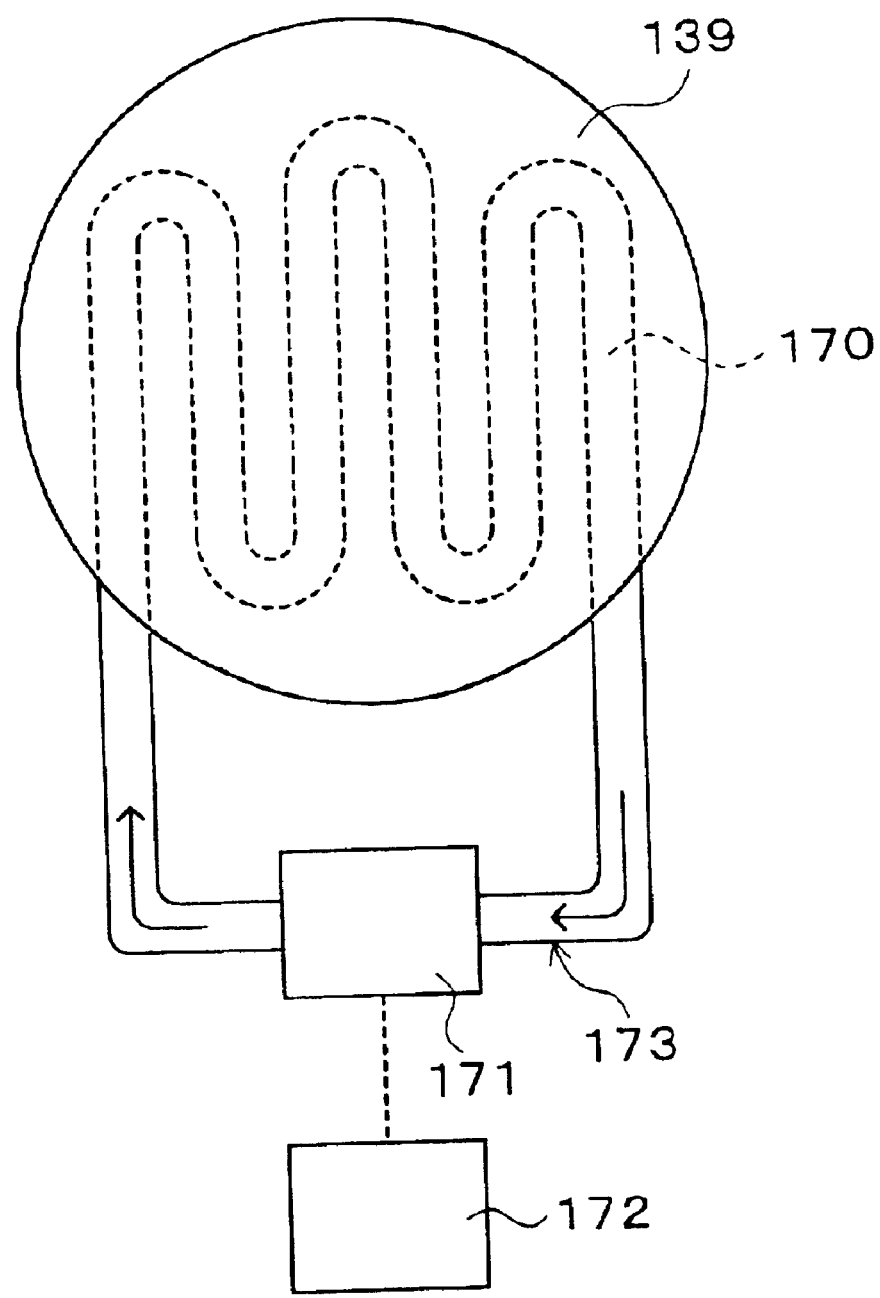
FIG. 14 is a plane view of a current plate when a temperature adjusting unit is provided to the current plate.

It is suitable to provide a function of adjusting temperature to the current plate 139 according to the above embodiment. For example as shown in FIG. 14, a temperature adjusting unit 173 including a circulating pipe line 170 which passes through the inside of the disc-shaped current plate 139, a supply section 171 which supplies the heat exchange fluid to the circulating pipe line 170, and an adjustment section 172 for adjusting the temperature of the heat exchange fluid is provided to the current plate 139. The circulating pipe line 170 is provided to enter from, for example, one end of the current plate 139, snake through the inside of the current plate 139, and penetrate through the other end of the current plate 139, in order to adjust the temperature of the current plate 139 without unevenness. The temperature of the current plate 139 is made to increase when, for example, the wafer W is subjected to the reduced-pressure drying processing in the reduced-pressure drying unit 150. Thereby, it is possible to prevent the evaporated solvent from causing condensation by coming into contact with the current plate 139.

Figure 15:
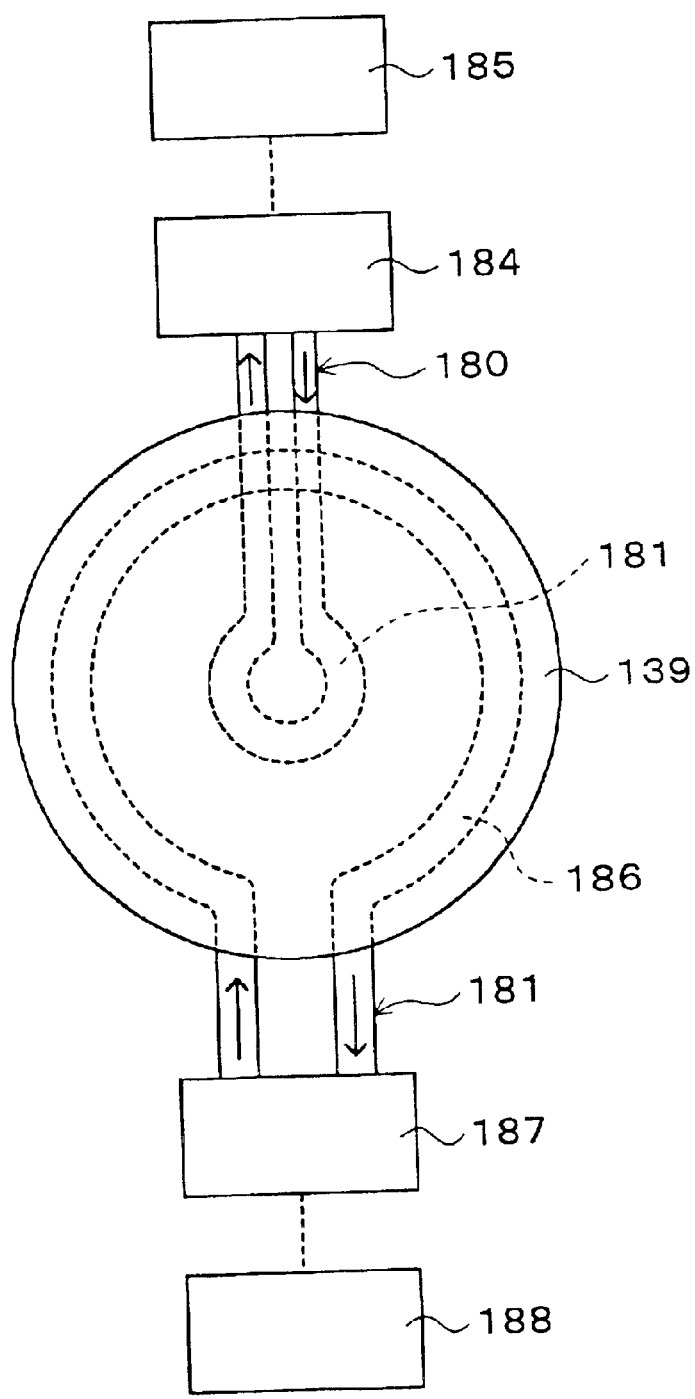
FIG. 15 is a plane view of a current plate when two temperature adjusting units are provided to the current plate.

Moreover, in the above-described embodiment, the temperature of the current plate 139 can be increased uniformly over its plane, but it is suitable to allow the temperature thereof to be increased differently between a part facing the center part of the wafer W and a part facing the peripheral edge part of the wafer W. In this case, for example as shown in FIG. 15, two separate temperature adjusting units 180 and 181 are provided to the current plate 139. The temperature adjusting unit 180 includes a circulating pipe line 183 which passes through the center part of the disc-shaped current plate 139 in a ring shape, a supply section 184 which supplies the heat exchange fluid to the circulating pipe line 183, and an adjustment section 185 which adjusts the temperature of the heat exchange fluid. Further, the temperature adjusting unit 181 includes a circulating pipe line 186 which passes through the peripheral edge part of the disc-shaped current plate 139 in a ring shape, a supply section 187 and an adjustment section 188 which are the same as those of the temperature adjusting unit 180.

The setting temperature of the temperature adjusting unit 181 is set to become higher than the setting temperature of the temperature adjusting unit 180 so that the temperature of the peripheral edge part of the current plate 139 becomes higher than the temperature of the center part of the current plate 139. Thereby, condensation of the solvent can be prevented efficiently in the peripheral edge part of the current plate 139 at which the evaporated solvent easily comes into contact therewith.

According to the above-described embodiment, the air supply pipe 127 is provided to the upper part of the tank 126 as the solvent supply source to supply the air to the gas phase region of the tank 126, thereby feeding the solvent vapor inside the tank 126 forcedly to the solvent vapor supply pipe 121, but the solvent may be supplied by using other methods.

Figure 16:
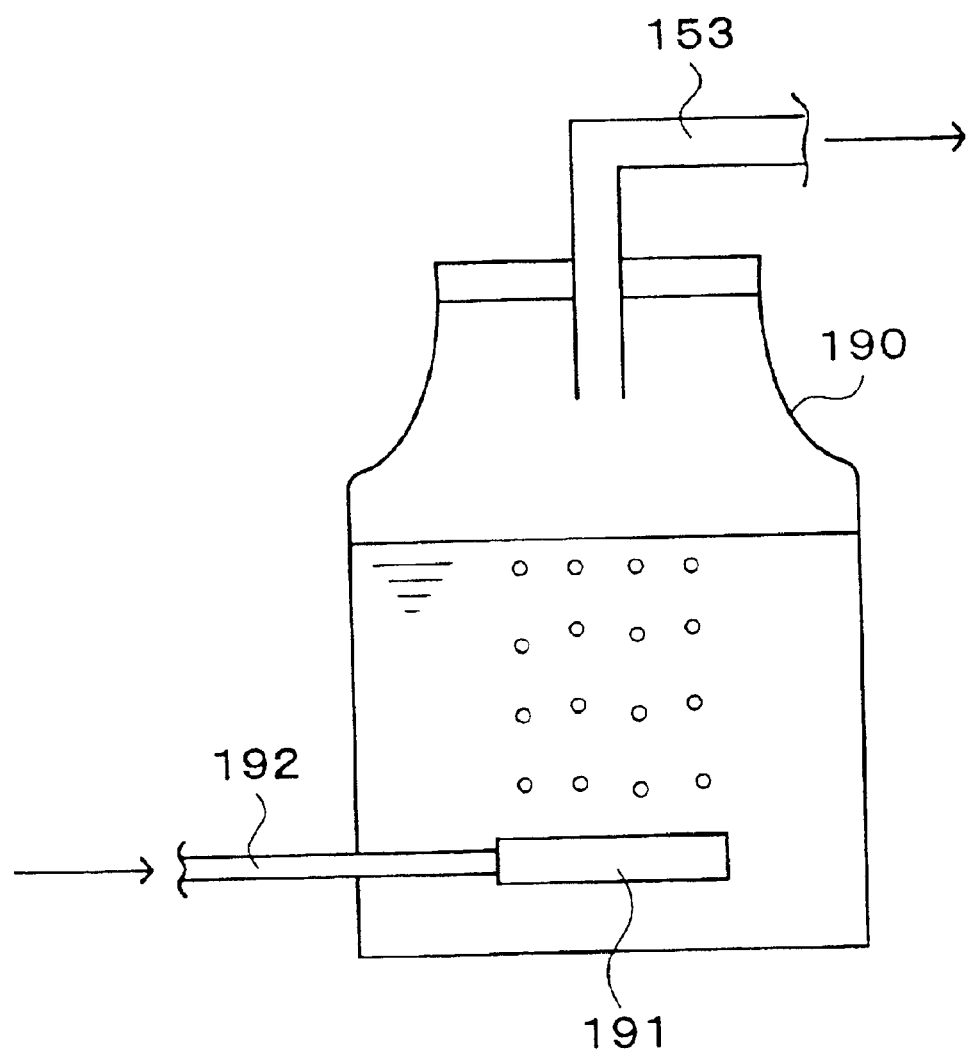
FIG. 16 is an explanatory view showing the structure of a tank when a bubble generating member is provided to the tank.
Figure 17:
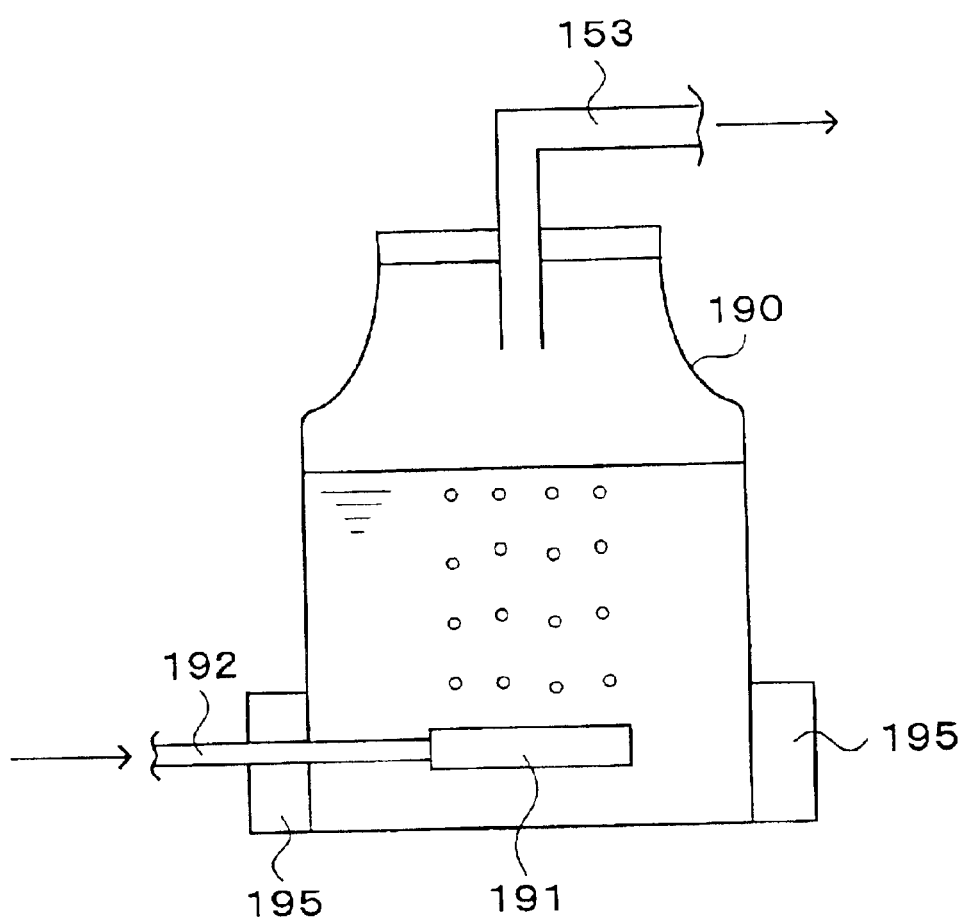
FIG. 17 is an explanatory view showing the structure of a tank when a heating member is attached to the tank shown in FIG. 16.

For example, as shown in FIG. 16, a bubble generating member 191, which is made of, for example, porous material, is provided at the bottom of the tank 190, and a joint 192 for supplying the predetermined air, for example, the nitrogen gas is provided to the bubble generating member 191. When the nitrogen gas is supplied from the joint 192 to the bubble generating member 191, fine bubbles of the nitrogen gas are formed in the liquid solvent and the liquid solvent dissolves into the bubbles. The bubbles in which the solvent is dissolved rise to the upper part of the tank 190, and the solvent vapor which is made of the bubbles gathered at the upper part of the tank 190 is supplied to the solvent vapor supply pipe 153. Thereby, the nitrogen gas comes in contact with the liquid solvent more widely as compared with the case of supplying the nitrogen gas to the upper part of the tank, and hence the larger volume of the solvent vapor can be supplied efficiently. Further, as shown in FIG. 17, it is also suitable to provide a heating member 195 to the tank 190 in order to facilitate the dissolution of the liquid solvent into the bubbles.

Figure 18:
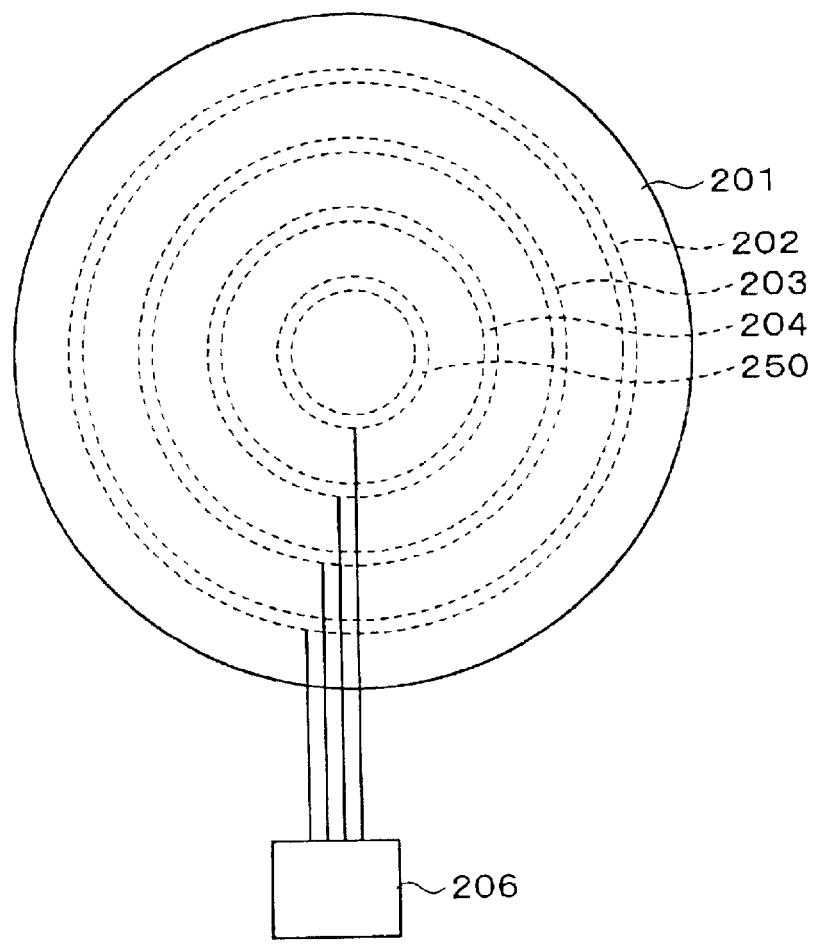
FIG. 18 is a plane view of a current plate having a function of adjusting temperature.

In the above explanation, it is possible to use a current plate 201 shown in FIG. 18 instead of the current plate 139 which has the function of adjusting the temperature as shown in FIG. 15.

Inside the current plate 201, for example, heaters 202, 203, 204 and 205 for adjusting the temperature are concentrically provided. The respective heaters 202, 203, 204 and 205 are independently controlled by a controller 206, respectively.

Figure 19:
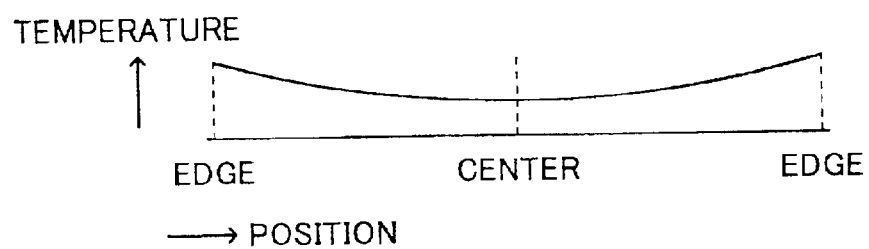
FIG. 19 is an explanatory view showing a temperature gradient of the current plate in FIG. 18.

According to thus-structured current plate 201, as shown in FIG. 19, it is possible to allow the temperature to be adjusted differently between a part facing the center part of the wafer W and a part facing the peripheral edge part of the wafer W, and to adjust the temperature so that the closer to the part facing the peripheral edge part, the higher the temperature becomes by degrees.

Thereby, it is possible to increase evaporation from the resist film in the peripheral edge part of the wafer W and to make the resist film on the wafer W uniform as a whole.

A Peltier element which is easily controlled may be used as the heaters 202, 203, 204 and 205.

In the above-described embodiments, the wafer W is coated with the resist solution onto its surface and exposed to the solvent atmosphere of the resist solution and thereafter, the wafer W is subjected to the reduced-pressure drying. However, instead of exposing it to the solvent atmosphere, it is suitable to apply pressure temporarily to the wafer W in the container.

Figure 20:
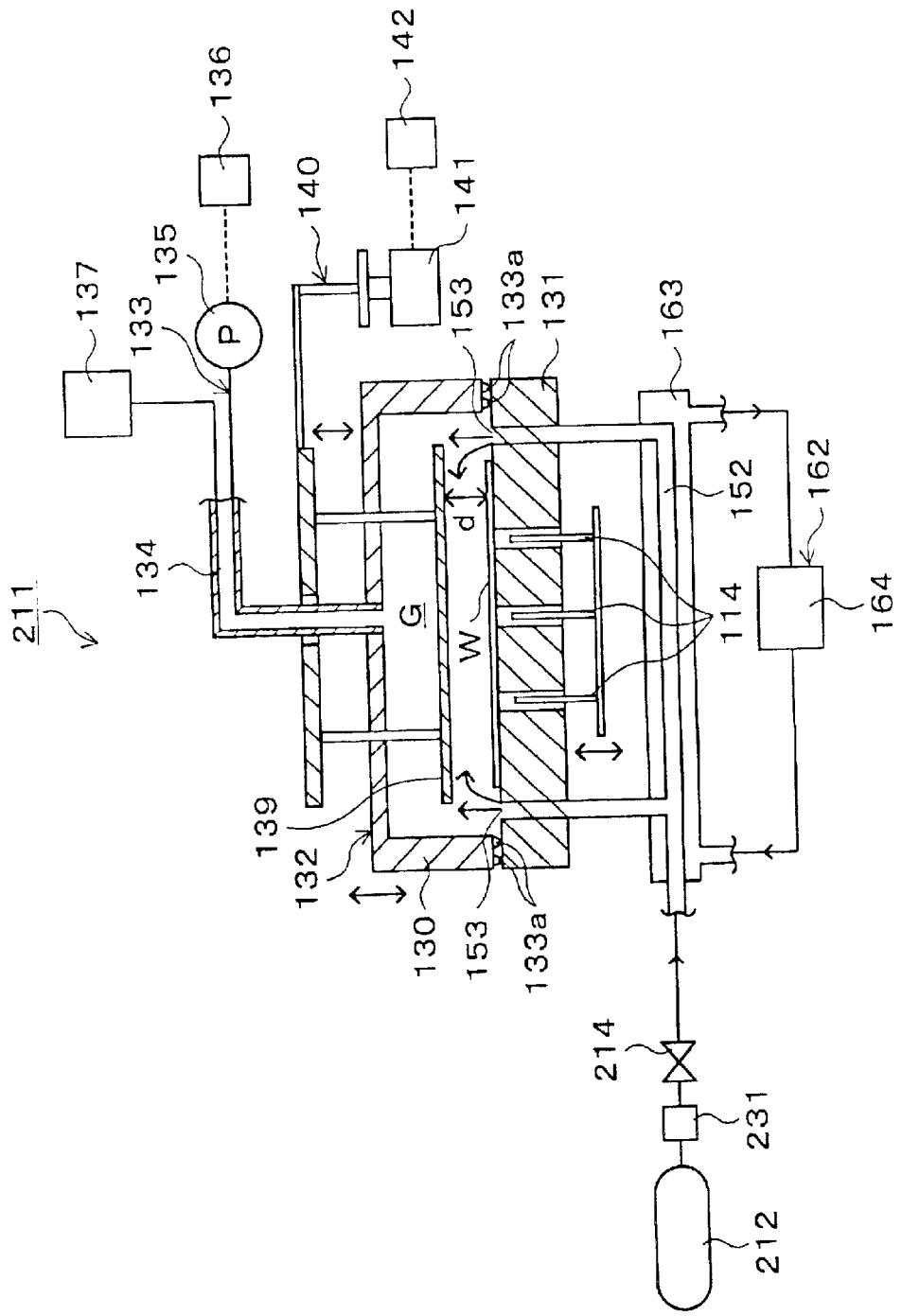
FIG. 20 is an explanatory view of a vertical section of a reduced-pressure drying unit which can apply pressure.
Figure 21:
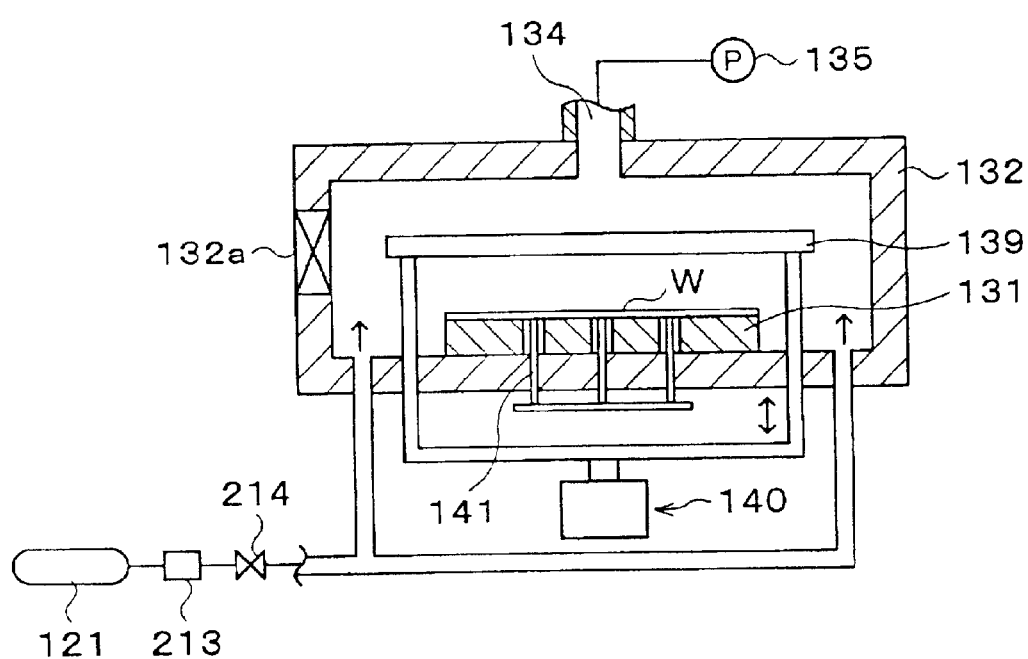
FIG. 21 is an explanatory view of a vertical section of a reduced-pressure drying unit having the structure of moving the current plate vertically from the lower part.

FIG. 20 shows a reduced-pressure drying unit 211 for realizing such a processing method. The reduced-pressure drying unit 211 includes a gas supply source 212 for supplying the inert gas, for example, the nitrogen gas into the container 132 through the supply pipe 152, a mass flow controller 213 for controlling flow volume and a valve 214.

The processing method using the reduced-pressure drying unit 211 will be explained. After coating the resist solution on the surface of the wafer W, the wafer W is carried into the container 132, and thereafter, the nitrogen gas is supplied into the container 132 to apply pressure to the inside of the container 132. For example, the pressure about two atmospheric pressure is applied thereto. The pressure of any atmospheric pressure can be realized by the control of the mass flow controller 213 and the vacuum pump 135.

Thereafter, the valve 214 of the gas supply source 212 is closed to reduce the pressure inside the container 132, thereby subjecting the resist film on the wafer W to the reduced-pressure drying. Thus, when this process of temporarily applying the pressure is adopted, the resist solution coated on the wafer W and the wafer W get to know each other well, which makes it possible to flatten the surface of the resist film R when it is subjected to the reduced-pressure drying after that. Thereby, even when the resist solution having relatively high viscosity is used in order to reduce the edge cutting width, it is possible to form the uniform resist film R having predetermined film thickness.

Incidentally, during the process of applying the pressure, it is suitable to heat the inside of the container 132 and the wafer W. In this case, the above-described current plates 139 and 201 which have the function of adjusting the temperature can be used. It is also suitable to control the temperature of the wafer W by providing a heater or a Peltier element in the mounting section 131.

In applying the pressure, for example, it is preferable to keep the temperature inside the container 132 and to control the temperature of the wafer W to be 30 to 35 degrees centigrade. Thereby, the viscosity of the resist solution coated onto the wafer W is decreased, which makes it possible to facilitate the flattening during the reduced-pressure drying after that, in cooperation with the operation of applying the pressure.

As the structure of the current plate having the function of adjusting the temperature, for example, it is preferable to use material which is excellent in thermal conductivity such as aluminum or stainless steel for its lower surface, that is, the surface facing the wafer W, and to use material with low thermal conductivity such as quartz glass for its upper layer. Thereby, it is possible to prevent imbalance of thermal radiation caused by a heater pattern, and to prevent an adverse effect on uniformity of the resist film.

Incidentally, the following process can be performed by using the reduced-pressure drying unit 211 shown in FIG. 20.

Namely, it is a method of moving the current 139 vertically during the reduced-pressure drying, after carrying the wafer W into the container 132, so as to improve the uniformity of the film thickness of the resist film.

Immediately after the wafer W is carried into the container 132 and the pressure is started to be reduced, for example, a gap d between the lower surface of the current plate 139 and the surface of the wafer W is kept to be relatively long, for example, about 5 mm. Thereby, the film thickness of the resist film on the surface of the wafer W, whose drying is still underway, is adjusted. Next, the current plate 139 is descended to allow the gap d to be relatively shorter than the above, for example, about 1 mm. Thereby, the resist film on the wafer W is sent away to its end so that the film as a whole is thinned, flattened and dried. According to this process, the aforesaid processing of temporarily applying the pressure is not necessary.

In the above-described reduced-pressure drying processing, the pressure inside the container 132 is preferably about 0.2×133.322 Pa to 5×133.322 Pa (0.2 Torr to 5.0 Torr), and more preferably, about 1.0×133.322 Pa (1 Torr).

In this kind of process, it is also suitable to control the temperature by using the above-described current plates 139 and 201 whose temperature can be adjusted as the current plate. In this case, while the gap d is kept to be relatively long, the temperature of the wafer W is allowed to be lower than the room temperature, for example, about 15 degrees centigrade, thereby preventing volatilization of the solvent from the resist film. While the gap d is kept to be relatively short, it is preferable that the temperature of the wafer W is controlled to be the room temperature such as 23 degrees centigrade. Therefore, the current plate used in this kind of process needs to have the function of adjusting the temperature which can control the wafer W to such temperature. Alternatively, it is suitable to provide a temperature adjusting unit, for example, a Peltier element, into the mounting section 131, which can control the temperature of the wafer W into such a range.

The reduced-pressure drying unit 211 shown in FIG. 20 has the structure in which the hoisting and lowering mechanism 140 for moving the current plate 319 vertically moves the current plate 139 vertically from the upper side thereof. However, it may have the structure in which the current plate 139 is moved vertically from the lower side thereof. Incidentally, when, for example, a pulse-controlled motor is adopted as a drive system of the hoisting and lowering mechanism 140, the vertical movement of the current plate 139 in mm unit as described above is facilitated. It should be noted that, in this example, the wafer W is carried into/out of the container 132 through a gate valve 132a provided at its side part.

In the above-described embodiments, the present invention is applied to the coating and developing system in which the resist solution is used as the coating solution to form the resist film. However, it is possible to apply the present invention to a film forming system in which another coating solution such as insulating material is used to form an interlayer insulator such as SOD (Spin on Dielectric), SOG (Spin on glass), Low-k film (organic silicon oxide film) and the like.

Moreover, in the above-described embodiments, the present invention is applied to the coating and developing system of the wafer in the photolithography process in the semiconductor device fabrication process, but the present invention may be applied to a processing system of a substrate other than the semiconductor wafer, for example, an LCD substrate, a reticle substrate and the like.

Furthermore, in the above explanation, even when tubes are used instead of the "pipe" of, for example, the exhaust pipe and the like, these have the identical operations and effects and hence it is of course that the tubes are included in the present invention.

According to the present invention, the coating method in the manner of the so-called one continuous writing stroke is used, thereby reducing the amount of the coating solution. When the coating treatment of the substrate is preformed by this coating method, it is possible to reduce the edge cutting width in using the coating solution having high viscosity and to ensure an in-plane uniformity of the substrate.

What is claimed is:

1. A processing system for processing a substrate, comprising:

a coating unit for coating the substrate with a coating solution;

a solvent atmosphere unit for exposing the substrate to a solvent atmosphere of the coating solution; and a reduced-pressure drying unit for subjecting the substrate to reduced-pressure drying, wherein said coating unit comprises a coating solution discharge nozzle for discharging the coating solution onto the substrate, and a moving mechanism for relatively moving the coating solution discharge nozzle and the substrate, said solvent atmosphere unit comprises a chamber for holding the substrate in a prescribed atmosphere, and a solvent vapor supply mechanism for supplying a solvent vapor of the coating solution of a prescribed concentration into the chamber through a supply pipe, said reduced-pressure drying unit comprises a pressure reducing mechanism for reducing pressure inside a container in which the substrate is housed;

the container is provided with an exhaust pipe for exhausting an atmosphere inside the container and a current plate for controlling a direction of airflow generated by exhaust from the exhaust pipe;

a surface of the current plate facing the substrate is in parallel to the substrate; and the processing system further comprises a temperature adjusting unit for adjusting the temperature of the current plate.

2. A processing system as set forth in claim 1, wherein the temperature adjusting unit is capable of adjusting the temperature of the current plate to be different between a part facing a center part of the substrate and a part facing a peripheral edge part of the substrate.

3. A processing system as set forth in claim 1, wherein said temperature adjusting unit is capable of adjusting the temperature of the current plate to be different between a part facing the center part of the substrate and a part facing the peripheral edge part of the substrate, and adjusting so that the closer to the part facing the peripheral edge part, the higher the temperature becomes by degrees.

4. A processing system as set forth in claim 3, further comprising:

a temperature controller for controlling the temperature of the solvent vapor of the prescribed concentration flowing through the supply pipe.

5. A processing system as set forth in claim 3, wherein the solvent vapor supply mechanism comprises a control section for controlling the concentration of the solvent vapor of the coating solution.

6. A processing system as set forth in claim 5, wherein the solvent vapor supply mechanism comprises a solvent vapor supply pipe for allowing the solvent vapor of the coating solution to flow into the supply pipe, and a gas supply pipe for allowing a carrier gas of the solvent vapor to flow into the supply pipe, wherein adjustment valves for adjusting flow volume are respectively provided to the solvent vapor supply pipe and the gas supply pipe, and wherein the adjustment valves are controlled by a control section.

7. A processing system for processing a substrate, comprising:

a coating unit for coating the substrate with a coating solution; and a reduced-pressure drying unit for exposing the substrate to a solvent atmosphere of the coating solution and thereafter subjecting the substrate to reduced-pressure drying, wherein said coating unit comprises a coating solution discharge nozzle for discharging the coating solution onto the substrate, and a moving mechanism for relatively moving the coating solution discharge nozzle and the substrate;

said reduced-pressure drying unit comprises a container for housing the substrate and containing the substrate airtightly, a solvent vapor supply mechanism for supplying a solvent vapor of the coating solution of a prescribed concentration into the container through a supply pipe, and a pressure reducing mechanism for reducing pressure inside the container;

the container is provided with an exhaust pipe for exhausting an atmosphere inside the container and a current plate for controlling a direction of airflow generated by exhaust from the exhaust pipe;

a surface of the current plate facing the substrate is parallel to the substrate; and the processing system further comprises a temperature adjusting unit for adjusting the temperature of the current plate.

8. A processing system as set forth in claim 7, wherein the temperature adjusting unit is capable of adjusting the temperature of the current plate to be different between a part facing a center part of the substrate and a part facing a peripheral edge part of the substrate.

9. A processing system as set forth in claim 7, wherein said temperature adjusting unit is capable of adjusting the temperature of the current plate to be different between a part facing the center part of the substrate and a part facing the peripheral edge part of the substrate, and adjusting so that the closer to the part facing the peripheral edge part, the higher the temperature becomes by degrees.

10. A processing system as set forth in claim 7, further comprising:

a temperature controller for controlling the temperature of the solvent vapor of the prescribed concentration flowing through the supply pipe.

11. A processing system as set forth in claim 7, wherein the solvent vapor supply mechanism comprises a control section for controlling the concentration of the solvent vapor of the coating solution.

12. A processing system as set forth in claim 11, wherein the solvent vapor supply mechanism comprises a solvent vapor supply pipe for allowing the solvent vapor of the coating solution to flow into the supply pipe, and a gas supply pipe for allowing a carrier gas of the solvent vapor to flow into the supply pipe, wherein adjustment valves for adjusting flow volume are respectively provided to the solvent vapor supply pipe and the gas supply pipe, and wherein the adjustment valves are controlled by a control section.

* * * * *